US011325859B2

(12) United States Patent
Burrows et al.

(10) Patent No.: US 11,325,859 B2
(45) Date of Patent: *May 10, 2022

(54) STATIC-DISSIPATIVE COATING TECHNOLOGY

(71) Applicant: Cardinal CG Company, Eden Prairie, MN (US)

(72) Inventors: Keith James Burrows, Mineral Point, WI (US); Kari B. Myli, Sauk City, WI (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/831,325

(22) Filed: Mar. 26, 2020

(65) Prior Publication Data

US 2020/0223747 A1 Jul. 16, 2020

Related U.S. Application Data

(63) Continuation of application No. 15/814,629, filed on Nov. 16, 2017, now Pat. No. 10,604,442.

(60) Provisional application No. 62/423,276, filed on Nov. 17, 2016.

(51) Int. Cl.
| | | |
|---|---|---|
| *C09D 1/00* | (2006.01) |
| *C09D 5/00* | (2006.01) |
| *C09K 3/16* | (2006.01) |
| *E06B 3/66* | (2006.01) |
| *E06B 7/28* | (2006.01) |
| *C23C 14/34* | (2006.01) |
| *C03C 17/245* | (2006.01) |
| *C03C 17/34* | (2006.01) |
| *C23C 14/00* | (2006.01) |
| *C03C 17/00* | (2006.01) |
| *C23C 4/134* | (2016.01) |
| *C23C 14/08* | (2006.01) |

(52) U.S. Cl.
CPC ........ *C03C 17/2456* (2013.01); *C03C 17/002* (2013.01); *C03C 17/3423* (2013.01); *C03C 17/3435* (2013.01); *C09D 1/00* (2013.01); *C09D 5/00* (2013.01); *C09K 3/16* (2013.01); *C23C 4/134* (2016.01); *C23C 14/0036* (2013.01); *C23C 14/083* (2013.01); *C23C 14/34* (2013.01); *C23C 14/3485* (2013.01); *E06B 3/66* (2013.01); *E06B 7/28* (2013.01); *C03C 2217/212* (2013.01); *C03C 2217/24* (2013.01); *C03C 2217/71* (2013.01); *C03C 2218/155* (2013.01); *C03C 2218/156* (2013.01)

(58) Field of Classification Search
None
See application file for complete search history.

(56) References Cited

U.S. PATENT DOCUMENTS

| | | |
|---|---|---|
| 1,256,818 A | 2/1918 | Nile |
| 2,082,582 A | 6/1937 | Kling |
| 2,780,553 A | 2/1957 | Pawlyk |
| 2,808,351 A | 10/1957 | Colbert et al. |
| 3,284,181 A | 11/1966 | Harrell et al. |
| 3,505,092 A | 4/1970 | Ryan et al. |
| 3,528,906 A | 9/1970 | Cash, Jr. et al. |
| 3,679,291 A | 7/1972 | Apfel et al. |
| 3,727,666 A | 4/1973 | Sluis |
| 3,829,197 A | 8/1974 | Thelen |
| 3,840,451 A | 10/1974 | Demidov et al. |
| 3,844,924 A | 10/1974 | Cunningham et al. |
| 3,852,098 A | 12/1974 | Bloss et al. |
| 3,854,796 A | 12/1974 | Thelen |
| 3,911,579 A | 10/1975 | Lane et al. |
| 3,925,182 A | 12/1975 | Carmichael |
| 3,934,961 A | 1/1976 | Itoh et al. |
| 3,968,018 A | 7/1976 | Lane et al. |
| 3,970,037 A | 7/1976 | Sopko |
| 3,980,570 A | 9/1976 | Okuda et al. |
| 3,990,784 A | 11/1976 | Gelber |
| 4,012,119 A | 3/1977 | Adams et al. |
| 4,029,566 A | 6/1977 | Brandmair et al. |
| 4,045,125 A | 8/1977 | Farges |
| 4,052,520 A | 10/1977 | Chang et al. |
| 4,060,660 A | 11/1977 | Carlson et al. |
| 4,107,350 A | 8/1978 | Berg et al. |
| 4,130,672 A | 12/1978 | Onoki et al. |

(Continued)

FOREIGN PATENT DOCUMENTS

| | | |
|---|---|---|
| CA | 2290999 A1 | 12/1998 |
| DE | 3906453 A1 | 9/1990 |

(Continued)

OTHER PUBLICATIONS

Anderson et al., "An Improved Photocatalyst of TiO2/SiO2 prepared by a Sol-Gel Synthesis", J. Phys. Chem., 1995, 99, 9882-9885.
Anderson et al., "Improved Photocatalytic Activity and Characterization of Mixed TiO2/SiO2 and TiO2/Al2O3 Materials", J. Phys. Chem., 1997, 101, 2611-2616.
Ang et al., "Deposition of high stability thin film ternary alloy resistors by sputtering," In: International conf. on Vacuum Metallurgy, 4th, Tokyo, Japan Jun. 4-8, 1973.
Bell et al., "Electrochromism in sol-gel deposited TiO2 films," Proceedings SPIE—The International Society for Optical Engineering, vol. 2255, Apr. 18-22, 1994, 10 pages.
Brat et al., "The Influence of Tungsten-10Wt% Titanium Sputtering Target Purity and Density on VLSI Applications," 2nd ASM International™ Electronic Materials and Processing Congress (Apr. 24-28, 1989, Philadelphia, PA).

(Continued)

*Primary Examiner* — Sheeba Ahmed
(74) *Attorney, Agent, or Firm* — Fredrikson & Byron, P.A.

(57) ABSTRACT

The invention provides a glass sheet or another transparent substrate on which there is provided a static-dissipative coating. The static-dissipative coating includes a film comprising titania. The film comprising titania preferably is exposed so as to define an outermost face of the static-dissipative coating. The static-dissipative coating is characterized by an indoor dust collection factor of less than 0.145.

22 Claims, 6 Drawing Sheets

(56) References Cited

U.S. PATENT DOCUMENTS

| | | |
|---|---|---|
| 4,166,018 A | 8/1979 | Chapin |
| 4,194,022 A | 3/1980 | Gillery |
| 4,212,663 A | 7/1980 | Aslami |
| 4,212,903 A | 7/1980 | Hammon et al. |
| 4,214,014 A | 7/1980 | Hofer et al. |
| 4,216,259 A | 8/1980 | Groth |
| 4,238,276 A | 12/1980 | Hanada et al. |
| 4,252,629 A | 2/1981 | Bewer et al. |
| 4,261,722 A | 4/1981 | Novak et al. |
| 4,322,276 A | 3/1982 | Meckel et al. |
| 4,331,526 A | 5/1982 | Kuehnle |
| 4,332,922 A | 6/1982 | Kossmehl et al. |
| 4,336,118 A | 6/1982 | Patten et al. |
| 4,336,119 A | 6/1982 | Gillery |
| 4,351,861 A | 9/1982 | Henery |
| 4,356,073 A | 10/1982 | McKelvey |
| 4,377,613 A | 3/1983 | Gordon |
| 4,422,721 A | 12/1983 | Hahn et al. |
| 4,422,916 A | 12/1983 | McKelvey |
| 4,422,917 A | 12/1983 | Hayfield |
| 4,440,822 A | 4/1984 | Gordon |
| 4,465,575 A | 8/1984 | Love et al. |
| 4,466,258 A | 8/1984 | Sando et al. |
| 4,466,877 A | 8/1984 | McKelvey |
| 4,485,146 A | 11/1984 | Mizuhashi et al. |
| 4,486,286 A | 12/1984 | Lewin et al. |
| 4,503,125 A | 3/1985 | Nelson et al. |
| 4,504,519 A | 3/1985 | Zelez |
| 4,556,599 A | 12/1985 | Sato et al. |
| 4,568,622 A | 2/1986 | Minami et al. |
| 4,569,738 A | 2/1986 | Kieser et al. |
| 4,571,350 A | 2/1986 | Parker et al. |
| 4,576,864 A | 3/1986 | Krautter et al. |
| 4,661,409 A | 4/1987 | Kieser et al. |
| 4,663,234 A | 5/1987 | Bouton |
| 4,673,475 A | 6/1987 | Windischmann |
| 4,692,428 A | 9/1987 | Murrell et al. |
| 4,704,339 A | 11/1987 | Green et al. |
| 4,713,311 A | 12/1987 | Senske et al. |
| 4,717,622 A | 1/1988 | Kurokawa et al. |
| 4,725,345 A | 2/1988 | Sakamoto et al. |
| 4,728,529 A | 3/1988 | Etzkorn et al. |
| 4,732,454 A | 3/1988 | Saito et al. |
| 4,737,252 A | 4/1988 | Hoffman |
| 4,769,291 A | 9/1988 | Belkind et al. |
| 4,777,090 A | 10/1988 | Ovshinsky et al. |
| 4,780,334 A | 10/1988 | Ackerman |
| 4,798,660 A | 1/1989 | Ermer et al. |
| 4,806,220 A | 2/1989 | Finley |
| 4,814,056 A | 3/1989 | Welty |
| 4,816,127 A | 3/1989 | Eltoukhy |
| 4,834,857 A | 5/1989 | Gillery |
| 4,838,935 A | 6/1989 | Dunlop et al. |
| 4,849,081 A | 7/1989 | Ross |
| 4,851,095 A | 7/1989 | Scobey et al. |
| 4,854,670 A | 8/1989 | Mellor |
| 4,859,493 A | 8/1989 | Lemelson |
| 4,861,680 A | 8/1989 | Meyer et al. |
| 4,882,827 A | 11/1989 | Kusumi et al. |
| 4,883,574 A | 11/1989 | Dos Santos Pereina Ribeiro |
| 4,883,721 A | 11/1989 | Nalepka et al. |
| 4,894,133 A | 1/1990 | Hedgcoth |
| 4,894,290 A | 1/1990 | Chesworth et al. |
| 4,902,580 A | 2/1990 | Gillery |
| 4,915,977 A | 4/1990 | Okamoto et al. |
| 4,919,778 A | 4/1990 | Dietrich et al. |
| 4,931,158 A | 6/1990 | Bunshah et al. |
| 4,931,213 A | 6/1990 | Cass |
| 4,931,315 A | 6/1990 | Mellor |
| 4,931,778 A | 6/1990 | Guajardo |
| 4,940,636 A | 7/1990 | Brock et al. |
| 4,952,430 A | 8/1990 | Bowser et al. |
| 4,954,465 A | 9/1990 | Kawashima et al. |
| 4,961,958 A | 10/1990 | Desphandey et al. |
| 4,963,240 A | 10/1990 | Fukasawa et al. |
| 4,981,568 A | 1/1991 | Taranko et al. |
| 4,990,234 A | 2/1991 | Szczyrbowski et al. |
| 4,995,893 A | 2/1991 | Jenkins et al. |
| 4,997,576 A | 3/1991 | Heller et al. |
| 5,006,248 A | 4/1991 | Anderson et al. |
| 5,008,002 A | 4/1991 | Uno et al. |
| 5,020,288 A | 6/1991 | Swensen |
| 5,026,415 A | 6/1991 | Yamamoto et al. |
| 5,032,421 A | 7/1991 | Sarma et al. |
| 5,035,784 A | 7/1991 | Anderson et al. |
| 5,047,131 A | 9/1991 | Wolfe et al. |
| 5,071,206 A | 12/1991 | Hood et al. |
| 5,073,241 A | 12/1991 | Watanabe |
| 5,073,450 A | 12/1991 | Nietering |
| 5,073,451 A | 12/1991 | Iida et al. |
| 5,090,985 A | 2/1992 | Soubeyrand et al. |
| 5,096,562 A | 3/1992 | Boozenny et al. |
| 5,104,539 A | 4/1992 | Anderson et al. |
| 5,105,310 A | 4/1992 | Dickey |
| 5,106,671 A | 4/1992 | Amberger et al. |
| 5,107,643 A | 4/1992 | Swensen |
| 5,108,574 A | 4/1992 | Kirs et al. |
| 5,110,637 A | 5/1992 | Ando et al. |
| 5,120,625 A | 6/1992 | Yamazaki et al. |
| 5,126,218 A | 6/1992 | Clarke |
| RE34,035 E | 8/1992 | Dimigen et al. |
| 5,139,633 A | 8/1992 | Kashida et al. |
| 5,160,534 A | 11/1992 | Hiraki |
| 5,165,972 A | 11/1992 | Porter |
| 5,168,003 A | 12/1992 | Proscia |
| 5,171,414 A | 12/1992 | Amberger et al. |
| 5,176,897 A | 1/1993 | Lester |
| 5,179,468 A | 1/1993 | Gasloli |
| 5,190,807 A | 3/1993 | Kimock et al. |
| 5,194,990 A | 3/1993 | Boulos et al. |
| 5,196,400 A | 3/1993 | Chen et al. |
| 5,201,926 A | 4/1993 | Szczyrbowski et al. |
| 5,209,996 A | 5/1993 | Kashida et al. |
| 5,211,759 A | 5/1993 | Zimmermann et al. |
| 5,216,542 A | 6/1993 | Szczyrbowski et al. |
| 5,234,487 A | 8/1993 | Wickersham, Jr. et al. |
| 5,244,554 A | 9/1993 | Yamagata et al. |
| 5,245,468 A | 9/1993 | Demiryont et al. |
| 5,254,392 A | 10/1993 | Burns et al. |
| 5,284,539 A | 2/1994 | McKernan et al. |
| 5,286,524 A | 2/1994 | Slutz et al. |
| 5,298,048 A | 3/1994 | Lingle et al. |
| 5,298,338 A | 3/1994 | Hiraki |
| 5,302,449 A | 4/1994 | Eby et al. |
| 5,306,547 A | 4/1994 | Hood et al. |
| 5,306,569 A | 4/1994 | Hiraki |
| 5,318,830 A | 6/1994 | Takamatsu et al. |
| 5,338,422 A | 8/1994 | Belkind et al. |
| 5,342,676 A | 8/1994 | Zagdoun |
| 5,346,600 A | 9/1994 | Nieh et al. |
| 5,354,446 A | 10/1994 | Kida et al. |
| 5,356,718 A | 10/1994 | Athey et al. |
| 5,366,764 A | 11/1994 | Sunthankar |
| 5,376,308 A | 12/1994 | Hirai et al. |
| 5,378,527 A | 1/1995 | Nakanishi et al. |
| 5,394,269 A | 2/1995 | Takamatsu et al. |
| 5,397,050 A | 3/1995 | Mueller |
| 5,401,543 A | 3/1995 | O'Neill et al. |
| 5,405,517 A | 4/1995 | Lampkin |
| 5,415,756 A | 5/1995 | Wolfe et al. |
| 5,417,827 A | 5/1995 | Finley |
| 5,424,130 A | 6/1995 | Nakanishi et al. |
| 5,453,459 A | 9/1995 | Roberts |
| 5,464,518 A | 11/1995 | Sieck et al. |
| 5,470,527 A | 11/1995 | Yamanobe et al. |
| 5,470,661 A | 11/1995 | Bailey et al. |
| 5,476,713 A | 12/1995 | Abiko et al. |
| 5,482,602 A | 1/1996 | Cooper et al. |
| 5,492,762 A | 2/1996 | Hirai et al. |
| 5,496,621 A | 3/1996 | Makita et al. |
| 5,498,475 A | 3/1996 | Takigawa et al. |
| 5,507,930 A | 4/1996 | Yamashita et al. |
| 5,512,152 A | 4/1996 | Schicht et al. |
| 5,513,039 A | 4/1996 | Lu et al. |

(56) References Cited

U.S. PATENT DOCUMENTS

| | | |
|---|---|---|
| 5,514,485 A | 5/1996 | Ando et al. |
| 5,520,996 A | 5/1996 | Balian et al. |
| 5,525,406 A | 6/1996 | Goodman et al. |
| 5,527,755 A | 6/1996 | Wenski et al. |
| 5,529,631 A | 6/1996 | Yoshikawa et al. |
| 5,552,180 A | 9/1996 | Finley et al. |
| 5,558,751 A | 9/1996 | Mahler et al. |
| 5,563,734 A | 10/1996 | Wolfe et al. |
| 5,569,362 A | 10/1996 | Lerbet et al. |
| 5,569,501 A | 10/1996 | Bailey et al. |
| 5,589,280 A | 12/1996 | Gibbons et al. |
| 5,593,784 A | 1/1997 | Chinzi |
| 5,593,786 A | 1/1997 | Parker et al. |
| 5,594,585 A | 1/1997 | Komatsu |
| 5,595,813 A | 1/1997 | Ogawa et al. |
| 5,595,825 A | 1/1997 | Guiselin |
| 5,597,622 A | 1/1997 | Zoeller et al. |
| 5,599,422 A | 2/1997 | Adams, Jr. et al. |
| 5,605,609 A | 2/1997 | Ando et al. |
| 5,607,723 A | 3/1997 | Plano et al. |
| 5,609,924 A | 3/1997 | McCurdy et al. |
| 5,611,899 A | 3/1997 | Maass |
| 5,616,225 A | 4/1997 | Sieck et al. |
| 5,616,532 A | 4/1997 | Heller et al. |
| 5,618,388 A | 4/1997 | Seeser et al. |
| 5,618,590 A | 4/1997 | Naruse et al. |
| 5,620,572 A | 4/1997 | Bjornard et al. |
| 5,620,577 A | 4/1997 | Taylor |
| 5,624,423 A | 4/1997 | Anjur et al. |
| 5,624,760 A | 4/1997 | Collins et al. |
| 5,633,208 A | 5/1997 | Ishikawa |
| 5,635,287 A | 6/1997 | Balian et al. |
| 5,643,423 A | 7/1997 | Kimock et al. |
| 5,643,432 A | 7/1997 | Qiu |
| 5,645,699 A | 7/1997 | Sieck |
| 5,645,900 A | 7/1997 | Ong et al. |
| 5,651,867 A | 7/1997 | Kokaku et al. |
| 5,652,477 A | 7/1997 | Tong et al. |
| 5,669,144 A | 9/1997 | Hahn et al. |
| 5,674,625 A | 10/1997 | Takahashi et al. |
| 5,674,658 A | 10/1997 | Burberry et al. |
| 5,679,431 A | 10/1997 | Chen et al. |
| 5,679,978 A | 10/1997 | Kawahara et al. |
| 5,683,560 A | 11/1997 | Szczyrbowski et al. |
| 5,683,561 A | 11/1997 | Hollars et al. |
| 5,686,372 A | 11/1997 | Langford et al. |
| 5,693,199 A | 12/1997 | Bourez et al. |
| 5,698,262 A | 12/1997 | Soubeyrand et al. |
| 5,715,103 A | 2/1998 | Amano et al. |
| 5,719,705 A | 2/1998 | Machol |
| 5,723,172 A | 3/1998 | Sherman |
| 5,724,187 A | 3/1998 | Varaprasad et al. |
| 5,725,746 A | 3/1998 | Dickey et al. |
| 5,725,957 A | 3/1998 | Varaprasad et al. |
| 5,733,660 A | 3/1998 | Makita et al. |
| 5,733,669 A | 3/1998 | Veyhl et al. |
| 5,744,215 A | 4/1998 | Neuman |
| 5,745,291 A | 4/1998 | Jenkinson |
| 5,750,265 A | 5/1998 | Goodman |
| 5,755,867 A | 5/1998 | Chikuni et al. |
| 5,762,674 A | 6/1998 | Maltby et al. |
| 5,762,766 A | 6/1998 | Kurita et al. |
| 5,763,087 A | 6/1998 | Falabella |
| 5,780,119 A | 7/1998 | Dearnaley et al. |
| 5,780,149 A | 7/1998 | McCurdy et al. |
| 5,780,202 A | 7/1998 | Nagahara et al. |
| 5,780,380 A | 7/1998 | Endoh et al. |
| 5,789,040 A | 8/1998 | Martinu et al. |
| 5,811,191 A | 9/1998 | Neuman |
| 5,812,405 A | 9/1998 | Meredith |
| 5,814,195 A | 9/1998 | Lehan et al. |
| 5,814,196 A | 9/1998 | Hollars et al. |
| 5,820,994 A | 10/1998 | Gotoh et al. |
| 5,827,490 A | 10/1998 | Jones |
| 5,830,252 A | 11/1998 | Finley et al. |
| 5,830,327 A | 11/1998 | Kolenkow |
| 5,830,332 A | 11/1998 | Babich et al. |
| 5,846,613 A | 12/1998 | Neuville |
| 5,849,200 A | 12/1998 | Heller et al. |
| 5,853,866 A | 12/1998 | Watanabe et al. |
| 5,854,169 A | 12/1998 | Heller et al. |
| 5,854,708 A | 12/1998 | Komatsu et al. |
| 5,863,398 A | 1/1999 | Kardokus et al. |
| 5,866,199 A | 2/1999 | Swidler et al. |
| 5,866,260 A | 2/1999 | Adams, Jr. et al. |
| 5,869,187 A | 2/1999 | Nakamura et al. |
| 5,869,808 A | 2/1999 | Hyllberg |
| 5,871,843 A | 2/1999 | Yoneda et al. |
| 5,873,203 A | 2/1999 | Thiel |
| 5,874,701 A | 2/1999 | Watanabe et al. |
| 5,877,391 A | 3/1999 | Kanno et al. |
| 5,888,593 A | 3/1999 | Petrmichl et al. |
| 5,891,556 A | 4/1999 | Anderson et al. |
| 5,896,553 A | 4/1999 | Lo |
| 5,897,957 A | 4/1999 | Goodman |
| 5,935,716 A | 8/1999 | McCurdy et al. |
| 5,939,188 A | 8/1999 | Moncur et al. |
| 5,939,194 A | 8/1999 | Hashimoto et al. |
| 5,939,201 A | 8/1999 | Boire et al. |
| 5,948,538 A | 9/1999 | Brochot et al. |
| 5,961,843 A | 10/1999 | Hayakawa et al. |
| 5,962,115 A | 10/1999 | Zmelty et al. |
| 5,965,246 A | 10/1999 | Guiselin et al. |
| 5,968,328 A | 10/1999 | Teschner et al. |
| 5,972,184 A | 10/1999 | Hollars et al. |
| 5,981,426 A | 11/1999 | Langford et al. |
| 5,993,734 A | 11/1999 | Snowman et al. |
| 5,998,339 A | 12/1999 | Kato et al. |
| 6,001,486 A | 12/1999 | Varaprasad et al. |
| 6,002,460 A | 12/1999 | Yamamoto |
| 6,010,602 A | 1/2000 | Arbab et al. |
| 6,013,372 A | 1/2000 | Hayakawa et al. |
| 6,027,766 A | 2/2000 | Greenberg et al. |
| 6,037,289 A | 3/2000 | Chopin et al. |
| 6,040,939 A | 3/2000 | Demiryont et al. |
| 6,045,903 A | 4/2000 | Seino et al. |
| 6,046,403 A | 4/2000 | Yoshikawa et al. |
| 6,054,024 A | 4/2000 | Toyama et al. |
| 6,054,227 A | 4/2000 | Greenberg et al. |
| 6,068,914 A | 5/2000 | Boire et al. |
| 6,071,606 A | 6/2000 | Yamazaki et al. |
| 6,071,623 A | 6/2000 | Sugawara et al. |
| 6,074,981 A | 6/2000 | Tada et al. |
| 6,077,482 A | 6/2000 | Kanno et al. |
| 6,077,492 A | 6/2000 | Anpo et al. |
| 6,087,012 A | 7/2000 | Varaprasad et al. |
| 6,090,489 A | 7/2000 | Hayakawa et al. |
| 6,103,363 A | 8/2000 | Boire et al. |
| 6,114,043 A | 9/2000 | Joret |
| 6,120,747 A | 9/2000 | Sugishima et al. |
| 6,124,044 A | 9/2000 | Swidler |
| 6,139,803 A | 10/2000 | Watanabe et al. |
| 6,139,968 A | 10/2000 | Knapp et al. |
| 6,153,067 A | 11/2000 | Maishev et al. |
| 6,154,311 A | 11/2000 | Simmons, Jr. et al. |
| 6,156,171 A | 12/2000 | Hollars et al. |
| 6,156,409 A | 12/2000 | Doushita et al. |
| 6,165,256 A | 12/2000 | Hayakawa et al. |
| 6,165,598 A | 12/2000 | Nelson |
| 6,165,616 A | 12/2000 | Lemelson et al. |
| 6,171,659 B1 | 1/2001 | Vanden et al. |
| 6,179,971 B1 | 1/2001 | Kittrell et al. |
| 6,179,972 B1 | 1/2001 | Kittrell |
| 6,191,062 B1 | 2/2001 | Hayakawa et al. |
| 6,193,378 B1 | 2/2001 | Tonar et al. |
| 6,193,856 B1 | 2/2001 | Kida et al. |
| 6,194,346 B1 | 2/2001 | Tada et al. |
| 6,197,101 B1 | 3/2001 | Matsumura et al. |
| 6,210,750 B1 | 4/2001 | Cho et al. |
| 6,210,779 B1 | 4/2001 | Watanabe et al. |
| 6,228,480 B1 | 5/2001 | Kimura et al. |
| 6,228,502 B1 | 5/2001 | Saitoh et al. |
| 6,238,738 B1 | 5/2001 | McCurdy |
| 6,242,752 B1 | 6/2001 | Soma et al. |

(56) References Cited

U.S. PATENT DOCUMENTS

| | | |
|---|---|---|
| 6,248,397 B1 | 6/2001 | Ye |
| 6,261,693 B1 | 7/2001 | Veerasamy |
| 6,270,633 B1 | 8/2001 | Onaka et al. |
| 6,274,244 B1 | 8/2001 | Finley et al. |
| 6,291,762 B1 | 9/2001 | Jan et al. |
| 6,299,981 B1 | 10/2001 | Azzopardi et al. |
| 6,319,326 B1 | 11/2001 | Koh et al. |
| 6,319,594 B1 | 11/2001 | Suzuki et al. |
| 6,326,079 B1 | 12/2001 | Philippe et al. |
| 6,329,060 B1 | 12/2001 | Barkac et al. |
| 6,329,925 B1 | 12/2001 | Skiver et al. |
| 6,333,084 B1 | 12/2001 | Woodard et al. |
| 6,334,938 B2 | 1/2002 | Kida et al. |
| 6,335,479 B1 | 1/2002 | Yamada et al. |
| 6,336,998 B1 | 1/2002 | Wang |
| 6,337,124 B1 | 1/2002 | Anderson et al. |
| 6,338,777 B1 | 1/2002 | Longstreth White |
| 6,346,174 B1 | 2/2002 | Finley et al. |
| 6,350,397 B1 | 2/2002 | Heikkila et al. |
| 6,352,755 B1 | 3/2002 | Finley et al. |
| 6,354,109 B1 | 3/2002 | Boire et al. |
| 6,362,121 B1 | 3/2002 | Chopin et al. |
| 6,365,010 B1 | 4/2002 | Hollars |
| 6,365,014 B2 | 4/2002 | Finley |
| 6,368,664 B1 | 4/2002 | Veerasamy et al. |
| 6,368,668 B1 | 4/2002 | Kobayashi et al. |
| 6,379,746 B1 | 4/2002 | Birch et al. |
| 6,379,764 B1 | 4/2002 | Pusateri et al. |
| 6,379,776 B1 | 4/2002 | Tada et al. |
| 6,387,844 B1 | 5/2002 | Fujishima et al. |
| 6,403,689 B1 | 6/2002 | Lehaut et al. |
| 6,413,581 B1 | 7/2002 | Greenberg et al. |
| 6,413,604 B1 | 7/2002 | Matthews et al. |
| 6,414,213 B2 | 7/2002 | Ohmori et al. |
| 6,419,800 B2 | 7/2002 | Anzaki et al. |
| 6,423,404 B1 | 7/2002 | Ohtsuka et al. |
| 6,425,670 B1 | 7/2002 | Komatsu et al. |
| 6,428,172 B1 | 8/2002 | Hutzel et al. |
| 6,436,542 B1 | 8/2002 | Ogino et al. |
| 6,440,278 B1 | 8/2002 | Kida et al. |
| 6,440,491 B1 | 8/2002 | Varaprasad et al. |
| 6,447,123 B2 | 9/2002 | Tonar et al. |
| 6,451,178 B2 | 9/2002 | Szczyrbowski et al. |
| 6,461,686 B1 | 10/2002 | Vanderstraeten |
| 6,464,951 B1 | 10/2002 | Kittrell et al. |
| 6,465,088 B1 | 10/2002 | Talpaert et al. |
| 6,468,402 B1 | 10/2002 | Vanderstraeten |
| 6,468,403 B1 | 10/2002 | Shimizu et al. |
| 6,468,428 B1 | 10/2002 | Nishii et al. |
| 6,488,824 B1 | 12/2002 | Hollars et al. |
| 6,500,690 B1 | 12/2002 | Yamagishi et al. |
| 6,501,387 B2 | 12/2002 | Skiver et al. |
| 6,511,309 B1 | 1/2003 | Hunter |
| 6,511,587 B2 | 1/2003 | Vanderstraeten |
| 6,570,709 B2 | 5/2003 | Katayama et al. |
| 6,571,729 B2 | 6/2003 | Sasaki et al. |
| 6,576,344 B1 | 6/2003 | Doushita et al. |
| 6,582,839 B1 | 6/2003 | Yamamoto et al. |
| 6,596,664 B2 | 7/2003 | Kittrell et al. |
| 6,620,454 B2 | 9/2003 | Varaprasad et al. |
| 6,635,155 B2 | 10/2003 | Miyamura et al. |
| 6,652,974 B1 | 11/2003 | Krisko |
| 6,660,365 B1 | 12/2003 | Krisko et al. |
| 6,673,738 B2 | 1/2004 | Ueda et al. |
| 6,677,063 B2 | 1/2004 | Finley |
| 6,679,978 B2 | 1/2004 | Johnson et al. |
| 6,680,135 B2 | 1/2004 | Boire et al. |
| 6,682,773 B2 | 1/2004 | Medwick et al. |
| 6,716,323 B1 | 4/2004 | Siddle |
| 6,720,066 B2 | 4/2004 | Talpaert et al. |
| 6,722,159 B2 | 4/2004 | Greenberg et al. |
| 6,726,330 B2 | 4/2004 | Kitabayashi |
| 6,730,630 B2 | 5/2004 | Okusako et al. |
| 6,733,889 B2 | 5/2004 | Varanasi et al. |
| 6,743,343 B2 | 6/2004 | Kida et al. |
| 6,743,749 B2 | 6/2004 | Morikawa et al. |
| 6,746,775 B1 | 6/2004 | Boire et al. |
| 6,761,984 B2 | 7/2004 | Anzaki et al. |
| 6,770,321 B2 | 8/2004 | Hukari et al. |
| 6,777,030 B2 | 8/2004 | Veerasamy et al. |
| 6,777,091 B2 | 8/2004 | Kijima et al. |
| 6,781,738 B2 | 8/2004 | Kikuchi et al. |
| 6,787,199 B2 | 9/2004 | Anpo et al. |
| 6,789,906 B2 | 9/2004 | Tonar et al. |
| 6,794,065 B1 | 9/2004 | Morikawa et al. |
| 6,800,182 B2 | 10/2004 | Mitsui et al. |
| 6,800,183 B2 | 10/2004 | Takahashi |
| 6,800,354 B2 | 10/2004 | Baumann et al. |
| 6,804,048 B2 | 10/2004 | MacQuart et al. |
| 6,811,856 B2 | 11/2004 | Nun et al. |
| 6,818,309 B1 | 11/2004 | Talpaert et al. |
| 6,829,084 B2 | 12/2004 | Takaki et al. |
| 6,830,785 B1 | 12/2004 | Hayakawa et al. |
| 6,833,089 B1 | 12/2004 | Kawahara et al. |
| 6,835,688 B2 | 12/2004 | Morikawa et al. |
| 6,840,061 B1 | 1/2005 | Hurst et al. |
| 6,846,556 B2 | 1/2005 | Boire et al. |
| 6,849,328 B1 | 2/2005 | Medwick et al. |
| 6,869,644 B2 | 3/2005 | Buhay et al. |
| 6,870,657 B1 | 3/2005 | Fitzmaurice et al. |
| 6,872,441 B2 | 3/2005 | Baumann et al. |
| 6,875,319 B2 | 4/2005 | Nadaud et al. |
| 6,878,242 B2 | 4/2005 | Wang et al. |
| 6,878,450 B2 | 4/2005 | Anpo et al. |
| 6,881,701 B2 | 4/2005 | Jacobs |
| 6,890,656 B2 | 5/2005 | Iacovangelo et al. |
| 6,902,813 B2 | 6/2005 | O'Shaughnessy et al. |
| 6,908,698 B2 | 6/2005 | Yoshida et al. |
| 6,908,881 B1 | 6/2005 | Sugihara |
| 6,911,593 B2 | 6/2005 | Mazumder et al. |
| 6,916,542 B2 | 7/2005 | Buhay et al. |
| 6,921,579 B2 | 7/2005 | O'Shaughnessy et al. |
| 6,929,862 B2 | 8/2005 | Hurst et al. |
| 6,939,446 B2 | 9/2005 | Krisko et al. |
| 6,939,611 B2 | 9/2005 | Fujishima et al. |
| 6,952,299 B1 | 10/2005 | Fukazawa et al. |
| 6,954,240 B2 | 10/2005 | Hamamoto et al. |
| 6,962,759 B2 | 11/2005 | Buhay et al. |
| 6,964,731 B1 | 11/2005 | Krisko et al. |
| 6,974,629 B1 | 12/2005 | Krisko et al. |
| 6,997,570 B2 | 2/2006 | Nakaho |
| 7,005,188 B2 | 2/2006 | Anderson et al. |
| 7,005,189 B2 | 2/2006 | Tachibana et al. |
| 7,011,691 B2 | 3/2006 | Abe |
| 7,022,416 B2 | 4/2006 | Teranishi |
| 7,049,002 B2 | 5/2006 | Greenberg et al. |
| 7,052,585 B2 | 5/2006 | Veerasamy et al. |
| 7,060,241 B2 | 6/2006 | Glatkowski |
| 7,060,359 B2 | 6/2006 | Eby et al. |
| 7,060,643 B2 | 6/2006 | Sanbayashi et al. |
| 7,096,692 B2 | 8/2006 | Greenberg et al. |
| 7,101,810 B2 | 9/2006 | Bond et al. |
| 7,118,936 B2 | 10/2006 | Kobayashi et al. |
| 7,122,253 B2 | 10/2006 | Yamaguchi et al. |
| 7,138,181 B2 | 11/2006 | McCurdy et al. |
| 7,157,840 B2 | 1/2007 | Fujishima et al. |
| 7,166,199 B2 | 1/2007 | Hartig |
| 7,175,911 B2 | 2/2007 | Zhou et al. |
| 7,179,527 B2 | 2/2007 | Sato et al. |
| 7,192,648 B2 | 3/2007 | Hartig et al. |
| 7,195,821 B2 | 3/2007 | Tixhon |
| 7,198,699 B2 | 4/2007 | Thomsen et al. |
| 7,209,202 B2 | 4/2007 | Saitoh |
| 7,211,513 B2 | 5/2007 | Remington, Jr. et al. |
| 7,211,543 B2 | 5/2007 | Nakabayashi et al. |
| 7,223,523 B2 | 5/2007 | Boykin et al. |
| 7,232,615 B2 | 6/2007 | Buhay et al. |
| 7,255,831 B2 | 8/2007 | Wei et al. |
| 7,261,942 B2 | 8/2007 | Andrews |
| 7,264,741 B2 | 9/2007 | Hartig |
| 7,285,314 B2 | 10/2007 | Mukunoki et al. |
| 7,294,365 B2 | 11/2007 | Hayakawa et al. |
| 7,294,403 B2 | 11/2007 | Krisko et al. |
| 7,294,404 B2 | 11/2007 | Krisko et al. |

(56) References Cited

U.S. PATENT DOCUMENTS

| | | |
|---|---|---|
| 7,300,634 B2 | 11/2007 | Yaniv et al. |
| 7,309,405 B2 | 12/2007 | Cho et al. |
| 7,309,527 B2 | 12/2007 | O'Shaughnessy et al. |
| 7,309,664 B1 | 12/2007 | Marzolin et al. |
| 7,311,961 B2 | 12/2007 | Finley et al. |
| 7,320,827 B2 | 1/2008 | Fujisawa et al. |
| 7,323,249 B2 | 1/2008 | Athey et al. |
| 7,339,728 B2 | 3/2008 | Hartig |
| 7,342,716 B2 | 3/2008 | Hartig |
| 7,348,054 B2 | 3/2008 | Jacquiod et al. |
| 7,354,624 B2 | 4/2008 | Millero et al. |
| 7,361,963 B2 | 4/2008 | Ikadai |
| 7,387,839 B2 | 6/2008 | Gueneau et al. |
| 7,391,491 B2 | 6/2008 | Saitoh |
| 7,413,766 B2 | 8/2008 | Satake et al. |
| 7,491,301 B2 | 2/2009 | Krisko et al. |
| 7,534,466 B2 | 5/2009 | Hartig |
| 7,572,509 B2 | 8/2009 | Hartig |
| 7,572,510 B2 | 8/2009 | Hartig |
| 7,572,511 B2 | 8/2009 | Hartig |
| 7,597,930 B2 | 10/2009 | Boire et al. |
| 7,604,865 B2 | 10/2009 | Krisko et al. |
| 7,713,632 B2 | 5/2010 | Krisko et al. |
| 7,737,080 B2 | 6/2010 | Labrousse et al. |
| 7,749,364 B2 | 7/2010 | Hartig |
| 7,763,340 B2 | 7/2010 | Sakai et al. |
| 7,820,296 B2 | 10/2010 | Myli et al. |
| 7,820,309 B2 | 10/2010 | Myli et al. |
| 7,824,043 B2 | 11/2010 | Hatano et al. |
| 7,862,910 B2 | 1/2011 | Krisko et al. |
| 7,906,203 B2 | 3/2011 | Hartig |
| 7,911,571 B2 | 3/2011 | Saitoh |
| 7,923,114 B2 | 4/2011 | Myli et al. |
| 7,955,687 B2 | 6/2011 | Nghiem et al. |
| 8,007,901 B2 | 8/2011 | Beinat et al. |
| 8,057,907 B2 | 11/2011 | Yoneyama et al. |
| 8,088,475 B2 | 1/2012 | Sasaki et al. |
| 8,092,657 B2 | 1/2012 | De Bosscher et al. |
| 8,092,660 B2 | 1/2012 | Myli et al. |
| RE43,817 E | 11/2012 | Krisko et al. |
| 8,310,635 B2 | 11/2012 | Saitoh |
| RE44,155 E | 4/2013 | Krisko et al. |
| 8,506,768 B2 | 8/2013 | Myli et al. |
| 8,623,475 B2 | 1/2014 | Inoue et al. |
| 8,696,879 B2 | 4/2014 | Myli et al. |
| 8,717,518 B2 | 5/2014 | Kim et al. |
| 8,784,933 B2 | 7/2014 | Krzyak et al. |
| 8,883,251 B2 | 11/2014 | Satake et al. |
| 9,079,217 B2 | 7/2015 | Jagannathan et al. |
| 9,097,843 B2 | 8/2015 | Weng et al. |
| 9,120,698 B2 | 9/2015 | Park |
| 9,126,858 B2 | 9/2015 | Park |
| 9,310,522 B2 | 4/2016 | Eguchi et al. |
| 9,376,853 B2 | 6/2016 | Hartig |
| 9,383,481 B2 | 7/2016 | Kim et al. |
| 9,453,365 B2 | 9/2016 | Myli et al. |
| 10,604,442 B2* | 3/2020 | Burrows .................. E06B 3/66 |
| 2001/0007715 A1 | 7/2001 | Toyoshima et al. |
| 2001/0016262 A1 | 8/2001 | Toyoshima et al. |
| 2001/0030808 A1 | 10/2001 | Komatsu et al. |
| 2002/0012779 A1 | 1/2002 | Miyashita et al. |
| 2002/0014634 A1 | 2/2002 | Koyama et al. |
| 2002/0016250 A1 | 2/2002 | Hayakawa et al. |
| 2002/0028361 A1 | 3/2002 | Boire et al. |
| 2002/0045073 A1 | 4/2002 | Finley |
| 2002/0046945 A1 | 4/2002 | Hosokawa et al. |
| 2002/0071956 A1 | 6/2002 | Boire et al. |
| 2002/0102352 A1 | 8/2002 | Hartig et al. |
| 2002/0110638 A1 | 8/2002 | Boire et al. |
| 2002/0119307 A1 | 8/2002 | Boire et al. |
| 2002/0155265 A1 | 10/2002 | Choi et al. |
| 2002/0155299 A1 | 10/2002 | Harris et al. |
| 2002/0172775 A1 | 11/2002 | Buhay et al. |
| 2002/0189938 A1 | 12/2002 | Baldwin et al. |
| 2003/0038028 A1 | 2/2003 | Schultheis et al. |
| 2003/0039843 A1 | 2/2003 | Johnson et al. |
| 2003/0043464 A1 | 3/2003 | Dannenberg |
| 2003/0048538 A1 | 3/2003 | Tonar et al. |
| 2003/0054177 A1 | 3/2003 | Jin |
| 2003/0064179 A1* | 4/2003 | Kijima .................. C23C 14/083 428/34.4 |
| 2003/0064231 A1 | 4/2003 | Hurst et al. |
| 2003/0096701 A1 | 5/2003 | Fujishima et al. |
| 2003/0143437 A1 | 7/2003 | Ohtsu et al. |
| 2003/0150712 A1 | 8/2003 | Reiter et al. |
| 2003/0152780 A1 | 8/2003 | Baumann et al. |
| 2003/0180547 A1 | 9/2003 | Buhay et al. |
| 2003/0186089 A1 | 10/2003 | Kikuchi et al. |
| 2003/0207028 A1 | 11/2003 | Boire et al. |
| 2003/0215647 A1 | 11/2003 | Yoshida et al. |
| 2003/0224620 A1 | 12/2003 | Kools et al. |
| 2003/0235695 A1 | 12/2003 | Greenberg et al. |
| 2003/0235720 A1 | 12/2003 | Athey et al. |
| 2004/0005466 A1 | 1/2004 | Arai et al. |
| 2004/0009356 A1 | 1/2004 | Medwick et al. |
| 2004/0020761 A1 | 2/2004 | Thomsen et al. |
| 2004/0032655 A1 | 2/2004 | Kikuchi et al. |
| 2004/0043260 A1 | 3/2004 | Nadaud et al. |
| 2004/0063320 A1 | 4/2004 | Hollars |
| 2004/0069623 A1 | 4/2004 | Vanderstraeten |
| 2004/0090577 A1 | 5/2004 | Hara |
| 2004/0115362 A1 | 6/2004 | Hartig et al. |
| 2004/0140198 A1 | 7/2004 | Cho et al. |
| 2004/0146721 A1 | 7/2004 | Hartig et al. |
| 2004/0149307 A1 | 8/2004 | Hartig |
| 2004/0157044 A1 | 8/2004 | Kang et al. |
| 2004/0163945 A1 | 8/2004 | Hartig |
| 2004/0179978 A1 | 9/2004 | Kobayashi et al. |
| 2004/0180216 A1 | 9/2004 | Veerasamy et al. |
| 2004/0180220 A1 | 9/2004 | Gueneau et al. |
| 2004/0196580 A1 | 10/2004 | Nakaho |
| 2004/0202890 A1 | 10/2004 | Kutilek et al. |
| 2004/0206024 A1 | 10/2004 | Graf et al. |
| 2004/0214010 A1 | 10/2004 | Murata et al. |
| 2004/0216487 A1 | 11/2004 | Boire et al. |
| 2004/0241490 A1 | 12/2004 | Finley |
| 2004/0247901 A1 | 12/2004 | Suzuki et al. |
| 2004/0248725 A1 | 12/2004 | Hiraoka et al. |
| 2004/0253382 A1 | 12/2004 | De Bosscher et al. |
| 2004/0253471 A1 | 12/2004 | Thiel et al. |
| 2005/0003672 A1 | 1/2005 | Kools et al. |
| 2005/0016835 A1 | 1/2005 | Krisko et al. |
| 2005/0020444 A1 | 1/2005 | Hiraoka et al. |
| 2005/0025982 A1 | 2/2005 | Krisko et al. |
| 2005/0031876 A1 | 2/2005 | Lu et al. |
| 2005/0042375 A1 | 2/2005 | Minami et al. |
| 2005/0044894 A1 | 3/2005 | Nelson et al. |
| 2005/0051422 A1 | 3/2005 | Rietzel et al. |
| 2005/0084688 A1 | 4/2005 | Garrec et al. |
| 2005/0106397 A1 | 5/2005 | Krisko et al. |
| 2005/0137084 A1 | 6/2005 | Krisko et al. |
| 2005/0138874 A1 | 6/2005 | O'Shaughnessy et al. |
| 2005/0191505 A1 | 9/2005 | Akarsu et al. |
| 2005/0191522 A1 | 9/2005 | Anzaki et al. |
| 2005/0221098 A1 | 10/2005 | Azzopardi et al. |
| 2005/0227008 A1 | 10/2005 | Okada et al. |
| 2005/0233893 A1 | 10/2005 | Sakatani et al. |
| 2005/0233899 A1 | 10/2005 | Anzaki et al. |
| 2005/0238861 A1 | 10/2005 | Buhay et al. |
| 2005/0244678 A1 | 11/2005 | Arfsten et al. |
| 2005/0245382 A1 | 11/2005 | Iwahashi et al. |
| 2005/0245383 A1 | 11/2005 | Iwahashi et al. |
| 2005/0247555 A1 | 11/2005 | Thiel |
| 2005/0248824 A1 | 11/2005 | Fukazawa et al. |
| 2005/0252108 A1 | 11/2005 | Sanderson et al. |
| 2005/0258030 A1 | 11/2005 | Finley et al. |
| 2005/0266248 A1 | 12/2005 | Millero et al. |
| 2005/0272590 A1 | 12/2005 | Iwahashi et al. |
| 2006/0000706 A1 | 1/2006 | Krisko et al. |
| 2006/0003545 A1 | 1/2006 | Veerasamy |
| 2006/0011945 A1 | 1/2006 | Spitzer-Keller et al. |
| 2006/0014027 A1 | 1/2006 | Oudard |
| 2006/0014050 A1 | 1/2006 | Gueneau et al. |
| 2006/0019104 A1 | 1/2006 | Hurst et al. |

(56) References Cited

U.S. PATENT DOCUMENTS

| | | |
|---|---|---|
| 2006/0029813 A1 | 2/2006 | Kutilek et al. |
| 2006/0029818 A1 | 2/2006 | Suzuki et al. |
| 2006/0031681 A1 | 2/2006 | Smith et al. |
| 2006/0032739 A1 | 2/2006 | Ikeda et al. |
| 2006/0039096 A1 | 2/2006 | Chen |
| 2006/0051597 A1 | 3/2006 | Anzaki et al. |
| 2006/0055513 A1 | 3/2006 | French et al. |
| 2006/0070869 A1 | 4/2006 | Krisko et al. |
| 2006/0102465 A1 | 5/2006 | Blondeel et al. |
| 2006/0107599 A1 | 5/2006 | Luten |
| 2006/0110605 A1 | 5/2006 | Luten et al. |
| 2006/0118406 A1 | 6/2006 | Delahoy et al. |
| 2006/0121315 A1 | 6/2006 | Myli et al. |
| 2006/0127604 A1 | 6/2006 | Ikadai |
| 2006/0134322 A1 | 6/2006 | Harris et al. |
| 2006/0134436 A1 | 6/2006 | Maschwitz |
| 2006/0141290 A1 | 6/2006 | Sheel et al. |
| 2006/0152832 A1 | 7/2006 | Aumercier et al. |
| 2006/0159906 A1 | 7/2006 | Messere et al. |
| 2006/0165996 A1 | 7/2006 | Veerasamy et al. |
| 2006/0194066 A1 | 8/2006 | Ye |
| 2006/0196765 A1 | 9/2006 | Cheng et al. |
| 2006/0201203 A1 | 9/2006 | Labrousse et al. |
| 2006/0210783 A1 | 9/2006 | Seder et al. |
| 2006/0210810 A1 | 9/2006 | Harris et al. |
| 2006/0225999 A1 | 10/2006 | Fukawa et al. |
| 2006/0228476 A1 | 10/2006 | McCurdy |
| 2006/0233972 A1 | 10/2006 | Muramatsu et al. |
| 2006/0234064 A1 | 10/2006 | Baubet et al. |
| 2006/0247125 A1 | 11/2006 | Choi et al. |
| 2006/0260938 A1 | 11/2006 | Petrach |
| 2006/0263610 A1 | 11/2006 | Greenberg et al. |
| 2006/0275612 A1 | 12/2006 | Baubet et al. |
| 2007/0025000 A1 | 2/2007 | Lin et al. |
| 2007/0029187 A1 | 2/2007 | Krasnov |
| 2007/0029527 A1 | 2/2007 | Mills et al. |
| 2007/0030569 A1 | 2/2007 | Lu et al. |
| 2007/0031593 A1 | 2/2007 | Krasnov et al. |
| 2007/0031681 A1 | 2/2007 | Anzaki et al. |
| 2007/0031682 A1 | 2/2007 | Krasnov |
| 2007/0042893 A1 | 2/2007 | Koike et al. |
| 2007/0065670 A1 | 3/2007 | Varaprasad |
| 2007/0077406 A1 | 4/2007 | Jacobs et al. |
| 2007/0082124 A1 | 4/2007 | Hartig |
| 2007/0087187 A1 | 4/2007 | Lu et al. |
| 2007/0092734 A1 | 4/2007 | Durandeau et al. |
| 2007/0104896 A1 | 5/2007 | Matsunaga et al. |
| 2007/0108043 A1 | 5/2007 | Lu |
| 2007/0109543 A1 | 5/2007 | Hoffman et al. |
| 2007/0111012 A1 | 5/2007 | Rimmer et al. |
| 2007/0116966 A1 | 5/2007 | Mellott et al. |
| 2007/0116967 A1 | 5/2007 | Medwick et al. |
| 2007/0129248 A1 | 6/2007 | Labrousse et al. |
| 2007/0134501 A1 | 6/2007 | McMaster et al. |
| 2007/0137673 A1 | 6/2007 | Boykin et al. |
| 2007/0148064 A1 | 6/2007 | Labrousse |
| 2007/0184291 A1 | 8/2007 | Harris et al. |
| 2007/0196563 A1 | 8/2007 | Wuwen et al. |
| 2007/0218264 A1 | 9/2007 | Gueneau et al. |
| 2007/0218265 A1 | 9/2007 | Harris et al. |
| 2007/0218311 A1 | 9/2007 | O'Shaughnessy et al. |
| 2007/0224357 A1 | 9/2007 | Buhay et al. |
| 2007/0231501 A1 | 10/2007 | Finley |
| 2007/0236631 A1 | 10/2007 | Ohtani et al. |
| 2007/0237968 A1 | 10/2007 | Kijima et al. |
| 2007/0254163 A1 | 11/2007 | Veerasamy et al. |
| 2007/0254164 A1 | 11/2007 | Veerasamy et al. |
| 2007/0264494 A1 | 11/2007 | Krisko et al. |
| 2007/0275252 A1 | 11/2007 | Krasnov |
| 2007/0275253 A1 | 11/2007 | Thiel et al. |
| 2007/0291363 A1 | 12/2007 | Asakura et al. |
| 2008/0011408 A1 | 1/2008 | Maschwitz |
| 2008/0014349 A1 | 1/2008 | Otani et al. |
| 2008/0026156 A1 | 1/2008 | Mehta et al. |
| 2008/0026161 A1 | 1/2008 | Frings et al. |
| 2008/0062612 A1 | 3/2008 | Morioka et al. |
| 2008/0115471 A1 | 5/2008 | Labrousse et al. |
| 2008/0119352 A1 | 5/2008 | Kitaguchi |
| 2008/0124460 A1 | 5/2008 | Athey et al. |
| 2008/0188370 A1 | 8/2008 | Vormberg et al. |
| 2008/0198457 A1 | 8/2008 | Sakai et al. |
| 2009/0017249 A1 | 1/2009 | Suh et al. |
| 2009/0087593 A1 | 4/2009 | Kondo et al. |
| 2010/0028682 A1 | 2/2010 | Shinohara |
| 2010/0028684 A1 | 2/2010 | Mariscal et al. |
| 2010/0102620 A1 | 4/2010 | Sudo et al. |
| 2011/0165413 A1 | 7/2011 | Hartig |
| 2013/0078458 A1 | 3/2013 | Biver et al. |
| 2013/0120314 A1 | 5/2013 | Ishibashi et al. |
| 2013/0122311 A1 | 5/2013 | Yoshihara et al. |
| 2013/0220795 A1 | 8/2013 | Brabender et al. |
| 2013/0221225 A1 | 8/2013 | Jagannathan et al. |
| 2013/0260095 A1 | 10/2013 | Shimazaki et al. |
| 2014/0008115 A1 | 1/2014 | Sato et al. |
| 2014/0061028 A1 | 3/2014 | Hartig |
| 2014/0153122 A1 | 6/2014 | Wang et al. |
| 2014/0308533 A1 | 10/2014 | Yoshihara et al. |
| 2015/0002779 A1 | 1/2015 | Joten |
| 2015/0004397 A1 | 1/2015 | Horio et al. |
| 2015/0010748 A1 | 1/2015 | Chen et al. |
| 2015/0205025 A1 | 7/2015 | Park et al. |
| 2015/0248182 A1 | 9/2015 | Hsu et al. |
| 2015/0295111 A1 | 10/2015 | Blackwood et al. |
| 2016/0116644 A1 | 4/2016 | Eguchi et al. |

FOREIGN PATENT DOCUMENTS

| | | |
|---|---|---|
| DE | 4313284 A1 | 10/1994 |
| DE | 19736925 A1 | 3/1998 |
| DE | 19644752 A1 | 4/1998 |
| DE | 19831610 A1 | 1/1999 |
| DE | 10100221 A1 | 7/2001 |
| DE | 10100223 A1 | 7/2001 |
| EP | 157573 A2 | 10/1985 |
| EP | 207646 A1 | 1/1987 |
| EP | 470379 A1 | 2/1992 |
| EP | 500774 A1 | 9/1992 |
| EP | 279550 B1 | 4/1993 |
| EP | 369581 B1 | 12/1993 |
| EP | 574119 A2 | 12/1993 |
| EP | 590477 A1 | 4/1994 |
| EP | 515847 B1 | 2/1995 |
| EP | 636702 A1 | 2/1995 |
| EP | 637572 A1 | 2/1995 |
| EP | 689096 A1 | 12/1995 |
| EP | 689962 A2 | 1/1996 |
| EP | 737513 A1 | 10/1996 |
| EP | 328257 B1 | 4/1997 |
| EP | 787696 A1 | 8/1997 |
| EP | 820967 A1 | 1/1998 |
| EP | 771766 B1 | 9/1998 |
| EP | 870530 A1 | 10/1998 |
| EP | 753882 B1 | 11/1998 |
| EP | 884288 A2 | 12/1998 |
| EP | 799255 B1 | 2/1999 |
| EP | 901991 A2 | 3/1999 |
| EP | 345045 B2 | 1/2000 |
| EP | 838535 B1 | 2/2000 |
| EP | 639655 B1 | 9/2000 |
| EP | 1046727 A2 | 10/2000 |
| EP | 850203 B1 | 1/2001 |
| EP | 1066878 A1 | 1/2001 |
| EP | 657562 B1 | 9/2001 |
| EP | 601928 B1 | 10/2001 |
| EP | 850204 B1 | 12/2001 |
| EP | 1179515 A1 | 2/2002 |
| EP | 944557 B1 | 11/2002 |
| EP | 611733 B1 | 6/2003 |
| EP | 887104 B1 | 11/2003 |
| EP | 1375444 A1 | 1/2004 |
| EP | 1411386 A1 | 4/2004 |
| EP | 1424083 A1 | 6/2004 |
| EP | 1074525 B1 | 9/2004 |
| EP | 1466665 A1 | 10/2004 |

(56) References Cited

FOREIGN PATENT DOCUMENTS

| | | |
|---|---|---|
| EP | 1500634 A1 | 1/2005 |
| EP | 1518836 A2 | 3/2005 |
| EP | 1640149 A1 | 3/2006 |
| EP | 816466 B1 | 5/2006 |
| EP | 1506143 B1 | 5/2006 |
| EP | 1964821 A2 | 9/2008 |
| FR | 2699164 B1 | 2/1995 |
| FR | 2738813 A1 | 3/1997 |
| FR | 2738836 A1 | 3/1997 |
| FR | 2738812 B1 | 10/1997 |
| FR | 2800731 A1 | 5/2001 |
| FR | 2814094 A1 | 3/2002 |
| FR | 2838734 A1 | 10/2003 |
| FR | 2838735 A1 | 10/2003 |
| FR | 2857885 A1 | 1/2005 |
| FR | 2861385 A1 | 4/2005 |
| FR | 2861386 A1 | 4/2005 |
| FR | 2869897 A1 | 11/2005 |
| FR | 2884147 A1 | 10/2006 |
| GB | 232680 A | 4/1925 |
| GB | 1231280 A | 5/1971 |
| GB | 1426906 A | 3/1976 |
| GB | 1438462 A | 6/1976 |
| GB | 2028376 A | 3/1980 |
| GB | 1595061 A | 8/1981 |
| GB | 2201428 A | 9/1988 |
| GB | 2302102 A | 1/1997 |
| GB | 2316687 A | 3/1998 |
| GB | 2327428 A | 1/1999 |
| JP | S57140339 A | 8/1982 |
| JP | S6081048 A | 5/1985 |
| JP | S6191042 A | 5/1986 |
| JP | S62161945 A | 7/1987 |
| JP | S6414129 A | 1/1989 |
| JP | H01118807 A | 5/1989 |
| JP | H03122274 A | 5/1991 |
| JP | H03187039 A | 8/1991 |
| JP | H03193872 A | 8/1991 |
| JP | H04276066 A | 10/1992 |
| JP | H05214525 A | 8/1993 |
| JP | H05253544 A | 10/1993 |
| JP | H06330297 A | 11/1994 |
| JP | H07149545 A | 6/1995 |
| JP | H07215074 A | 8/1995 |
| JP | H07233469 A | 9/1995 |
| JP | H07508491 A | 9/1995 |
| JP | H07315874 A | 12/1995 |
| JP | H07315889 A | 12/1995 |
| JP | H0811631 A | 1/1996 |
| JP | H0812378 A | 1/1996 |
| JP | H08109043 A | 4/1996 |
| JP | H08134638 A | 5/1996 |
| JP | H08158048 A | 6/1996 |
| JP | H08227006 A | 9/1996 |
| JP | H09189801 A | 7/1997 |
| JP | H09202651 A | 8/1997 |
| JP | H09249967 A | 9/1997 |
| JP | H1036144 A | 2/1998 |
| JP | H1048805 A | 2/1998 |
| JP | H10140351 A | 5/1998 |
| JP | H10278165 A | 10/1998 |
| JP | H1 195014 A | 4/1999 |
| JP | H11180737 A | 7/1999 |
| JP | H11194201 A | 7/1999 |
| JP | H11302038 A | 11/1999 |
| JP | 2000094569 A | 4/2000 |
| JP | 2000145310 A | 5/2000 |
| JP | 2001026858 A | 1/2001 |
| JP | 2003311157 A | 11/2003 |
| JP | 2005213585 A | 8/2005 |
| JP | 2006036631 A | 2/2006 |
| JP | 2006305527 A | 11/2006 |
| KR | 1020040024582 A | 3/2004 |
| WO | 8706626 A1 | 11/1987 |
| WO | 8910430 A1 | 11/1989 |
| WO | 9217621 A1 | 10/1992 |
| WO | 9625534 A1 | 8/1996 |
| WO | 9703763 A1 | 2/1997 |
| WO | 9707066 A1 | 2/1997 |
| WO | 9707069 A1 | 2/1997 |
| WO | 9708359 A1 | 3/1997 |
| WO | 9710185 A1 | 3/1997 |
| WO | 9710186 A1 | 3/1997 |
| WO | 9711916 A1 | 4/1997 |
| WO | 9715499 A1 | 5/1997 |
| WO | 9725201 A1 | 7/1997 |
| WO | 9725450 A1 | 7/1997 |
| WO | 9737801 A1 | 10/1997 |
| WO | 9737946 A1 | 10/1997 |
| WO | 9742351 A1 | 11/1997 |
| WO | 9742357 A1 | 11/1997 |
| WO | 9806675 A1 | 2/1998 |
| WO | 9823549 A1 | 6/1998 |
| WO | 9825700 A1 | 6/1998 |
| WO | 9911896 A1 | 3/1999 |
| WO | 9944954 A1 | 9/1999 |
| WO | 0013257 A1 | 3/2000 |
| WO | 0015571 A1 | 3/2000 |
| WO | 0027771 A1 | 5/2000 |
| WO | 0037376 A1 | 6/2000 |
| WO | 0037377 A1 | 6/2000 |
| WO | 0040402 A1 | 7/2000 |
| WO | 0050354 A1 | 8/2000 |
| WO | 0075083 A1 | 12/2000 |
| WO | 0075087 A1 | 12/2000 |
| WO | 0102496 A2 | 1/2001 |
| WO | 0132578 A1 | 5/2001 |
| WO | 0168786 A1 | 9/2001 |
| WO | 0171055 A1 | 9/2001 |
| WO | 0204376 A1 | 1/2002 |
| WO | 0222516 A1 | 3/2002 |
| WO | 0222517 A1 | 3/2002 |
| WO | 0224333 A1 | 3/2002 |
| WO | 0224971 A1 | 3/2002 |
| WO | 0240417 A2 | 5/2002 |
| WO | 0249980 A1 | 6/2002 |
| WO | 02085809 A2 | 10/2002 |
| WO | 03009061 A2 | 1/2003 |
| WO | 03012540 A1 | 2/2003 |
| WO | 03050056 A1 | 6/2003 |
| WO | 03053577 A1 | 7/2003 |
| WO | 03062166 A2 | 7/2003 |
| WO | 03068500 A1 | 8/2003 |
| WO | 03072849 A1 | 9/2003 |
| WO | 03080530 A1 | 10/2003 |
| WO | 03087002 A1 | 10/2003 |
| WO | 03087005 A1 | 10/2003 |
| WO | 03091471 A2 | 11/2003 |
| WO | 03093188 A1 | 11/2003 |
| WO | 03095385 A1 | 11/2003 |
| WO | 03095695 A2 | 11/2003 |
| WO | 03097549 A1 | 11/2003 |
| WO | 03106732 A1 | 12/2003 |
| WO | 2004013376 A2 | 2/2004 |
| WO | 2004034105 A1 | 4/2004 |
| WO | 2004061151 A1 | 7/2004 |
| WO | 2004067464 A1 | 8/2004 |
| WO | 2004085699 A2 | 10/2004 |
| WO | 2004085701 A1 | 10/2004 |
| WO | 2004086104 A1 | 10/2004 |
| WO | 2004087985 A2 | 10/2004 |
| WO | 2004089836 A1 | 10/2004 |
| WO | 2004089838 A1 | 10/2004 |
| WO | 2004089839 A1 | 10/2004 |
| WO | 2004092088 A2 | 10/2004 |
| WO | 2004092089 A1 | 10/2004 |
| WO | 2004097063 A2 | 11/2004 |
| WO | 2004108618 A2 | 12/2004 |
| WO | 2004108619 A1 | 12/2004 |
| WO | 2004108846 A2 | 12/2004 |
| WO | 2004113064 A1 | 12/2004 |
| WO | 2005000758 A2 | 1/2005 |
| WO | 2005000759 A2 | 1/2005 |
| WO | 2005005337 A1 | 1/2005 |

(56) References Cited

FOREIGN PATENT DOCUMENTS

| WO | 2005007286 A1 | 1/2005 |
|---|---|---|
| WO | 2005009914 A2 | 2/2005 |
| WO | 2005012593 A1 | 2/2005 |
| WO | 2005023723 A1 | 3/2005 |
| WO | 2005040056 A2 | 5/2005 |
| WO | 2005040058 A1 | 5/2005 |
| WO | 2005063646 A1 | 7/2005 |
| WO | 2005102952 A2 | 11/2005 |
| WO | 2005102953 A2 | 11/2005 |
| WO | 2005110937 A2 | 11/2005 |
| WO | 2005111257 A2 | 11/2005 |
| WO | 2006004169 A1 | 1/2006 |
| WO | 2006007062 A2 | 1/2006 |
| WO | 2006017311 A1 | 2/2006 |
| WO | 2006017349 A1 | 2/2006 |
| WO | 2006019995 A2 | 2/2006 |
| WO | 2006020477 A2 | 2/2006 |
| WO | 2006028729 A1 | 3/2006 |
| WO | 2006036605 A1 | 4/2006 |
| WO | 2006054954 A1 | 5/2006 |
| WO | 2006055513 A2 | 5/2006 |
| WO | 2006057830 A2 | 6/2006 |
| WO | 2006062902 A2 | 6/2006 |
| WO | 2006064059 A1 | 6/2006 |
| WO | 2006064060 A1 | 6/2006 |
| WO | 2006066101 A2 | 6/2006 |
| WO | 2006070623 A1 | 7/2006 |
| WO | 2006077839 A1 | 7/2006 |
| WO | 2006089964 A1 | 8/2006 |
| WO | 2006101994 A2 | 9/2006 |
| WO | 2006108985 A1 | 10/2006 |
| WO | 2006117345 A1 | 11/2006 |
| WO | 2006134335 A1 | 12/2006 |
| WO | 2007016127 A2 | 2/2007 |
| WO | 2007018974 A2 | 2/2007 |
| WO | 2007018975 A1 | 2/2007 |
| WO | 2007045805 A2 | 4/2007 |
| WO | 2007080428 A1 | 7/2007 |
| WO | 2007092511 A2 | 8/2007 |
| WO | 2007093823 A1 | 8/2007 |
| WO | 2007096461 A2 | 8/2007 |
| WO | 2007110482 A1 | 10/2007 |
| WO | 2007121211 A2 | 10/2007 |
| WO | 2007121215 A1 | 10/2007 |
| WO | 2007127060 A2 | 11/2007 |
| WO | 2007130140 A1 | 11/2007 |
| WO | 2008063774 A2 | 5/2008 |
| WO | 2009036263 A2 | 3/2009 |

OTHER PUBLICATIONS

Chen Wen-mei et al, "The Effect of SiO2 Additive on Super-hydrophilic Property of TiO2—SiO2 Thin Film by Sol-gel Method", Journal of Wuhan University of Technology-Mater. Sci Ed (Sep. 2001), vol. 16, No. 3, 30-33.
Hill et al., Coated Glass Applications and Markets, BOC Coating Technology, 1999, 12 pages.
Creighton, "Non-Selective Tungsten CVD Using Tungsten Hexxacarbonyl," Sandia National Laboratories, Albuquerque, NM, 1987.
De Tacconi et al., "Nanoporous TiO2 and WO3 Films by Anodization of Titanium and Tungsten Substrates: Influence of process Variables on Morphology and Photoelectrochemical Response," J. Phys. Chem B 2006, 110, pp. 25347-25355.
Diesburg et al., "Low Mobile Ion Contamination From Sputtered High Purity Tungsten," 12th International Plansee Seminar, 1973, 1989, pp. 371-378.
Duley et al., "Refractive Indices for Amorphous Carbon," The Astrophysical Journal, vol. 287, Dec. 15, 1984, pp. 694-696.
Enesca et al., "Novel Approach of TiO2/WO3 for Water Splitting," 20th European photovoltaic Solar Energy Conference, Jun. 6-10, 2005, pp. 262-265.
Gao et al., "Great Enhancement of Photocatalytic Activity of Nitrogen-Doped Titania by Coupling with Tungsten Ozxide," J. Phys. Chem B 2006, 110, pp. 14391-14397.
Göttsche et al., "Electrochromic mixed Wo3-TiO2 thin films produced by sputtering and the sol-gel technique: a comparison," Solar Energy Materials and Solar Cells 31 (1993) pp. 415-428.
Guan et al, "Enhanced effect and mechanism of SiO2 addition in super-hydrophilic property of TiO2 films" Surf. And Coating Tech 173 (2003) pp. 219-223.
Guan, "Hydrophilic property of TiO2/SiO2 mixing films" Trans. Nonferrous Met. Soc. China (2004), vol. 14, No. 2, pp. 251-254.
Guan, "Relationship between photocatalytic activity, hydrophilicity and self-cleaning effect of TiO2/SiO2 films" Surf. And Coating Tech 191 (2005) pp. 155-160.
Gusev et al., "Sputtering of tungsten, tungsten oxide, and tungsten-carbon mixed layers by deuterium ions in the threshold energy region," Tech Phys. 44 (9), Sep. 1999, pp. 1123-1127.
Hamelmann et al., "Metal oxide/silicon oxide multilayer with smooth interfaces produced by in situ controlled plasma-enhanced MOCVD," Thin Solid Films 358 (2000), pp. 90-93.
Hans-Joachim Becker et al., "Herstellung und Eigenschaften von Flachgläsern, die mittels Hochvakuum-zerstäu-bungsverfahrens beschichtet wurden" Magazine Silikattechnik 36 (1985) Issue 5, and English translation.
Hans-Joachin Gläser, "Beschichtung großflähiger Substratscheiben durch Kathodenzerstäubung" Glastechnische Berichte 56 (1983) No. 9, and English translation.
Hashimoto et al., "Lifetime of Electrochromism of Amorphous WO3—TiO2 thin Films," J. Electrochem. Soc., vol. 138, No. 8, Aug. 1991, pp. 2403-2408.
Herrera et al., "Synthesis, characterization, and catalytic function of novel highly dispersed tungsten oxide catalysts on mesoporous silica," J. Catalysis 239 (2006), pp. 200-211.
Higashimoto et al., "Photoelectrochemical properties of hybrid WO3TiO2 electrode. Effect of structures of WO3 on charge separation," Thin Solid Films 503 (2006), pp. 201-206.
Hodgson et al., "Photocatalytic Reactor Systems with Tungsten Oxide-Modified Titanium Dioxide for Indoor Air Applications," 11th Conference on TiO2 Photocatalysis: fundamentals & Applications (Sep. 25-28, 2006, Pittsburgh, PA).
Ingo et al., "XPS studies of SiO2—TiO2 powders prepared by sol-gel process", Appl. Surf. Sci. 1993, 70/71A, pp. 230-234.
Martin, "Ion-Based Methods For Optical Thin Film Deposition," Journal of Material Science, vol. 21, 1986, pp. 1-25.
Irie et al., "Interfacial structure dependence of layered TiO2/Wo3 thin films on the photoinduced hydrophilic property," Vacuum 74 (2004), pp. 625-629.
Jossen et al., "Thermal stability and catalytic activity of flame-made silica-vanadia-tungsten oxide-titania,", App. Catalysis B: Environmental 69 (2007), pp. 181-188.
Kanou, "Application of High Purity W for VLSI Sputtering Targets," 7th International Tungsten Symposium, Sep. 1996, pp. 410-418.
Katsumata et al., "Effect of microstructure on photoinduced hydrophilicity of transparent anatase thin films", Surface Science, 579 (2005) 123-130.
Keller et al., "Photocatalytic oxidation of butyl acetate in vapor phase on TiO2, Pt/TiO2 and WO3/TiO2 catalysts," Journal of Catalysis 215 (2003), pp. 129-138.
Kobayashi et al., "V2 O5—WO3/TiO2—SiO2—SO42-catalysts: Influence of active components and supports on activities in the selective catalytic reduction of NO by NH3 and in the oxidation of SO2" App. Cat. B: Enviro 63. (2006), pp. 104-113.
Lassaletta et al., "Spectroscopic Characterization of Quantum-Sized TiO2 Supported on Silica: Influence of Size and TiO2—SiO2 Interface Composition", J. Phys. Chem., 1995, 99, 484-1490.
Lo et al., "Influence of Target Structure on Film Stress in WTI Sputtering," Mat. Res. Soc. Symp. Proc. vol. 505, 1998, pp. 427-432.
Manfred Von Ardenne, "The Effects of Physics and Their Applications," Verlag Harri Deutsch, Thun and Frankfurt am Main, 1997, 11 pages including English translation.

(56) References Cited

OTHER PUBLICATIONS

Matthews et al., "An Adsorption Water Purifier with in Situ Photocatalytic Regeneration", J. Catal. 1988, 113, pp. 549-555.
MikroElektronick—High-rate Sputtering System for Two-Sided Coating (HZS-04), 2004.
Minero et al., "Role of Adsorption in Photocatalyzed Reactions of Organic Molecules in Aqueous of TiO2 Suspensions", Langmuir, 1992, 113, pp. 481-486.
Miyashita et al., "Spectrum response of the vacuum-deposited SiO2/TiO2 multilayer film with improved photo-catalytic activity", Journal of Materials Science Letters, 2001, 20, 2137-2140.
Miyashita, et al., "Enhanced Effect of Vacuum-deposited SiO2 Overlayer on Photo-induced Hydrophilicity of TiO2 Film", Journal of Materials Science 36 (2001) p. 3877-3884.
Miyauchi et al., "A Highly Hydrophilic Thin Film Under 1 μW/cm2 UV Illumination," Adv. Mater. 2000, 12, pp. 1923-1927.
Nakamura, et al., "Hydrophilic property of SiO2/TiO2 double layer films" Photocatalytic Coatings, Panel Session, 2006, pp. 345-350.
Niwa et al., Ammoxidation of Toluene Over SiO2—Al2O3 ZrO2—SiO2 and TiO2—SiO2, J. Catal. 1981, 69, pp. 69-76.
Novotná, et al., "Photocatalytical TiO2/SiO2—PDMS layers on glass" Photocatalytic Coatings, Panel Session, 2006, pp. 383-387.
O'Bannon, Dictionary of Ceramic Science and Engineering, 1984, pp. 12 & 117.
International Patent Application No. PCT/US2017/061919, International Search Report and Written Opinion dated Mar. 28, 2018, 14 pages.
Wu et al., "Synthesis and characterization of Sb-doped SnO2-(CeO2—TiO2) composite thin films deposited on glass substrates for antistatic electricity and UV-shielding," Journal of Rare Earths, vol. 28, Special Issue, Dec. 2010, pp. 189-193.
Sakoske et al., "Going Green With High Performance Nano-Coatings for Glass," Energy Efficiency & Coatings, Glass Performance Days, China, 2010, 11 pages (including 5 pages English translation).
Szczyrbowski et al., "Large-scale antireflective coatings on glass produced by reactive magnetron sputtering," Surface and Coatings Technology, vol. 98, 1998, pp. 1460-1466.
Anandan et al., "Superhydrophilic Graphene-Loaded TiO2 Thin Film for Self-Cleaning Applications," Applied Materials & Interfaces, Dec. 2012, pp. 207-212.
Sittinger et al., "Production of MF and DC-pulse sputtered antireflective/anti-static optical interference coatings using a large area in-line coater," Thin Solid Films, vol. 502, 2006, pp. 175-180.
Non-Final Rejection of the USPTO in U.S. Appl. No. 15/814,629, dated Sep. 19, 2019, 6 pgs.
Amendment and Response to Non-Final Rejection of the USPTO in U.S. Appl. No. 15/814,629, filed Jan. 17, 2020, 18 pgs.
Supplemental Amendment and Response to Non-Final Rejection of the USPTO in U.S. Appl. No. 15/814,629, filed Jan. 21, 2020, 18 pgs.
Notice of Allowance of the USPTO in U.S. Appl. No. 15/814,629, dated Feb. 10, 2020, 6 pgs.
Corrected Notice of Allowance of the USPTO in U.S. Appl. No. 15/814,629, dated Feb. 19, 2020, 5 pgs.
Ramirez-Del-Solar et al., "Effect of the Method of Preparation on the Texture of TiO2—SiO2 Gels", J. Non-Cryst Solids 1990, 121, pp. 84-89.
Richardson et al., "Tungsten-Vanadium Oxide Sputtered Films for Electrochromic Devices," http://btech.lbl.gov/papers/42381.pdf, 1998.
Saeki et al., "The Photoelectrochemical Response of TiO2-Wo3 Mixed Oxide Films Prepared by Thermal Oxidation of Titanium Coated with Tungsten," J. Electrochem. Soc., vol. 143, No. 7, Jul. 1996, pp. 2226-2229.
Salvado et al., "TiO2—SiO2 glasses prepared by the alkoxide route", J. Non-Cryst. Solids 1992, 147/148, pp. 256-261.
Satoh et al., "Sol-gel-derived binary silica glasses with high refractive index", J. Non-Cryst Solids 1992, 146, pp. 121-128.

Schiller et al., "Influence of Deposition Parameters on the Optical and Structural Properties of TiO2 Films Produced by Reactive D.C. Plasmetron Sputtering," Thin Solid Films 83 (1981), pp. 239-245.
Schintlmeister et al., "Optical Coatings (nb2O5, Ta2O5 and WO3) for LAC-applications Obtained by DC Quaslreactive magnetron Sputtering of Ceramic Sputtering Targets," 46th Annual Technical Conference Proceedings—Soc. Of Vacuum Coaters, May 3-8, 2003, pp. 296-301.
Schraml-Marth et al., "Porous silica gels and TiO2—SiO2 mixed oxides prepared via the sol-gel process: characterization by spectroscopic techniques", J. Non-Cryst. Solids 1992, 143, pp. 93-111.
Schwarz et al., "Thermal material spraying—an alternative technique for the production of special purpose sputtering targets," Thermal Spraying Conference, 1996, 5 pages including an English abstract.
Shen et al., "A new method to prepare tungsten and nitrogen co-doped titanium dioxide and its excellent photocatalytic activities irradiated by visible light," 11th Conference on TiO2 Photocatalysis: fundamentals & Applications (Sep. 25-28, 2006, Pittsburgh, PA).
Shibata, K., et al., "Acidic Properties of Binary Metal Oxides", Bull. Chem. Soc. Jpn. 1973, 46, pp. 2985-2988.
Shiyanovskaya et al., "Biocomponent WO3/TiO2 Films as Photoelectrodes," J. Electrochemical Soc. 146 (1999), pp. 243-249.
Sinel'nikova et al., "Interaction of a Mixture of Oxides of Tungsten and Silicon With Carbon," Soviet Powder Metallurgy and Metal Ceramics, vol. 29, No. 3(327), Mar. 1990, pp. 234-236.
Song et al., "Efficient degradation of organic pollutant with Wox modified nano TiO2 under visible irradiation," J. of Photochemistry and Photobiology A: Chemistry 181 (2006), pp. 421-428.
Staffler et al, "Advanced Coating Technology Based Upon Sputtering Targets Produced by Powder Metallurgy," Horizons of Powder Metallurgy Part I, Proceedings of the 1986 International Powder Metallurgy Conference and Exhibition, Jul. 7-11, 1986, pp. 219-222.
Stakheev, et al., "XPS and XAES Study of TiO2—SiO2 Mixed Oxide System", J. Phys. Chem. 1993, 97, pp. 5668-5672.
Stankova et al., "Thin (0 0 1) tungsten trioxide films grown by laser deposition," App. Surface Science 247 (2005), pp. 401-405.
Stella, "EPMA Analysis of Float Glass Surfaces." Mikorchimica Acta—vol. 114-115, Issue 1, Dec. 1994, pp. 475-480.
Stumpp et al., "Manufacturing of Superclean Refractory and Reactive Metals and Alloys in High Vacuum for Advanced Technologies," 8th ICVM: Special Melting/Refining and Metallurgical Coating Under Vacuum or Controlled Atmosphere, vol. 2, Sep. 1985, pp. 1310-1324.
Su et al., "All Solid-State Smart Window of Electrodeposited WO3 and TiO2 Particulate Film With PTREFG Gel Electrolyte," J Phys Chem Solids, vol. 59, No. 8, 1998, pp. 1175-1180.
"Surface Hardening of Ceramic and Glass Materials," IBM Technical Disclosure Bulletin, vol. 36, Issue 1 (Jan. 1993), p. 225.
"Surface Hardening of Ceramic and Glass Materials," IBM Technical Disclosure Bulletin, vol. 36, Issue 3 (Mar. 1993) pp. 291-292.
Szczyrbowski et al., "Properties of TiO2—Layers Prepared by Medium Frequency and DC Reactive Sputtering," 1997 Soc. Of Vacuum Coaters (1997), pp. 237-241.
Tada et al., "Deactivation of the TiO2 Photocatalyst by Coupling with WO3 and the Electrochemically Assisted High Photocatalytic Activity of WO3," Langmuir 20 (2004), pp. 4665-4670.
Takeuchi, et al., "Preparation of Titanium-Silicon Binary Oxide Thin Film Photocatalysts by an Ionized Cluster Beam Deposition Method. Their Photocatalytic Activity and Photoinduced Super-Hydrophilicity", J. Phys. Chem. 2003, 107, pp. 14278-14282.
Vakuumbeschichtung 5 Anwendungen Teil II, VDI Verlag 1993, ISBN 3-18-401315-4 and English translation.
Vakuumbeschichtung 5 Anwendungen Teil II, VDI Verlag 1993, ISBN 3-18-401313-8 and English translation.
Veersamy, et al., "Optical and Electronic Properties of Amorphous Diamond." Diamond and Related Materials, vol. 2 (1993), pp. 782-787.
Wachs et al., "Catalysis science of the solid acidity of model supported tungsten oxide catalysts," Catalysis Today 116 (2006), pp. 162-168.

(56) References Cited

OTHER PUBLICATIONS

Wilhartitz et al., "3D-SIMS analysis of ultra high purity molybdenum and tungsten: a characterisation of different manufacturing techniques," Fresenius J Anal chem. (1995) 353: pp. 524-532.

Yamamoto et al., "Characteristics of Tungsten Gate Devices for MOS VLSI's," Materials Research Society, 1985, pp. 297-311.

Yamamoto et al., "Fabrication of Highly Reliable Tungsten Gate MOS VLSI's," J. Electrochem. Soc., vol. 133, No. 2, Feb. 1986, pp. 401-407.

Yamauchi et al., "Development of W—Ti Binary Alloy Sputtering Target and Study of its sputtering Characteristics," Nippon Tungsten Review, vol. 22 (1989), pp. 55-72.

Yoo et al., "Effects of annealing temperature and method on structural and optical properties of TiO2 films prepared by RF magnetron sputtering at room temperature," App. Surface Science 253 (2007), pp. 3888-3892.

Yoon et al., "Growth kinetics and oxidation behavior of WSi2 coating formed by chemical vapor deposition of Si on W substrate," J. Alloys and Compounds 420 (2006), pp. 199-206.

Yu et al., "The grain size and surface hydroxyl content of super-hydrophilic TiO2—SiO2 composite nanometer thin films" J. Mat Sci. Lett. (2001) 20, pp. 1745-1748.

Zanhai et al., "Preparation of W—Ti Sputtering Targets under Inert Atmosphere," Chinese Journal of Rare Metals, vol. 30, No. 5, 2006, Abstract.

Zanhai et al., "Tungsten-Titanium Targets and Manufacturing Technology," Chinese Journal of Rare Metals, vol. 30, No. 1, 2006, Abstract.

Zeman et al., "Self-cleaning and antifogging effects of TiO2 films prepared by radio frequency magnetron sputtering," J. Vac. Sci. Technol. A, Mar./Apr. 2002, pp. 388-393.

Definition of "Engineer," from http://www.merriam-webster.com/dictionary/engineered, visited Apr. 18, 2013. No author.

U.S. Appl. No. 09/572,766, "Carbon-based soil-resistant coating for glass surfaces," filed May 17, 2000, 35 pages.

Cardinal Glass Industries—Neat Glass, Retrieved online from https://www.youtube.com/watch?v=PcQCUIzdHUw, Nov. 15, 2012, 3 pages.

NEAT Glass Manufacturer Video, Retrieved online from https://www.youtube.com/watch?v=DVOX8Pny3dY, Jul. 1, 2011, 3 pages.

Obee et al., "A Kinetic Study of Photocatalytic Oxidation of VOCs on WO3 Coated Titanium Dioxide," 11th Conference on TiO2 Photocatalysis: fundamentals & Applications (Sep. 25-28, 2006, Pittsburgh, PA).

Ohsaki, et al., "Photocatalytic properties of SnO2/TiO2 multilayers" Photocatalytic Coatings, Panel Session, 2006, pp. 369-376.

Okimura et al., "Characteristics of rutile TiO2 films prepared by R.F. magnetron sputtering at a low temperature," Thin Solid Films 281-282 (1996) pp. 427-430.

Ramana et al., "Structural Stability and Phase Transitions in WO3 Thin Films," J. Phys Chem B (2006), pp. 10430-10435.

\* cited by examiner

STATIC-DISSIPATIVE COATING TECHNOLOGY

RELATED APPLICATIONS

This application is a continuation of U.S. application Ser. No. 15/814,629, filed Nov. 16, 2017, and claims priority to U.S. Provisional Application No. 62/423,276, filed Nov. 17, 2016, the entire contents of each of which are incorporated herein by reference.

FIELD OF THE INVENTION

The present invention relates generally to coatings for glass and other substrates. More particularly, this invention relates to low-maintenance thin film coatings.

BACKGROUND OF THE INVENTION

Various types of photocatalytic coatings are known. Self-cleaning coatings based on $TiO_2$, for example, have been studied widely and reported on in the scientific literature. Many past efforts have sought to maximize the photocatalytic properties of the coating, in some cases with the goal of providing a self-cleaning window. In such cases, high levels of photoactivity are desired.

Contrary to the goal of such research efforts, it can be advantageous to provide low-maintenance coatings that have lower levels of photoactivity than self-cleaning coatings and yet stay cleaner than uncoated glass, are easier to clean than uncoated glass, or both.

Anti-static coatings have been developed as one type of low-maintenance coating. These coatings are often based on a transparent conductive oxide ("TCO") coating. The TCO coating typically has considerable thickness, and a relatively high level of electrical conductivity. The thickness tends to be large enough that the coating imparts more than an optimal amount of visible reflection, absorption and surface roughness.

It would be desirable to provide a low-maintenance coating that comprises titania and has a small thickness, minimal optical impact, and is static dissipative so as to provide controlled dust collection properties.

DETAILED DESCRIPTION OF PREFERRED EMBODIMENTS

Figure 1:
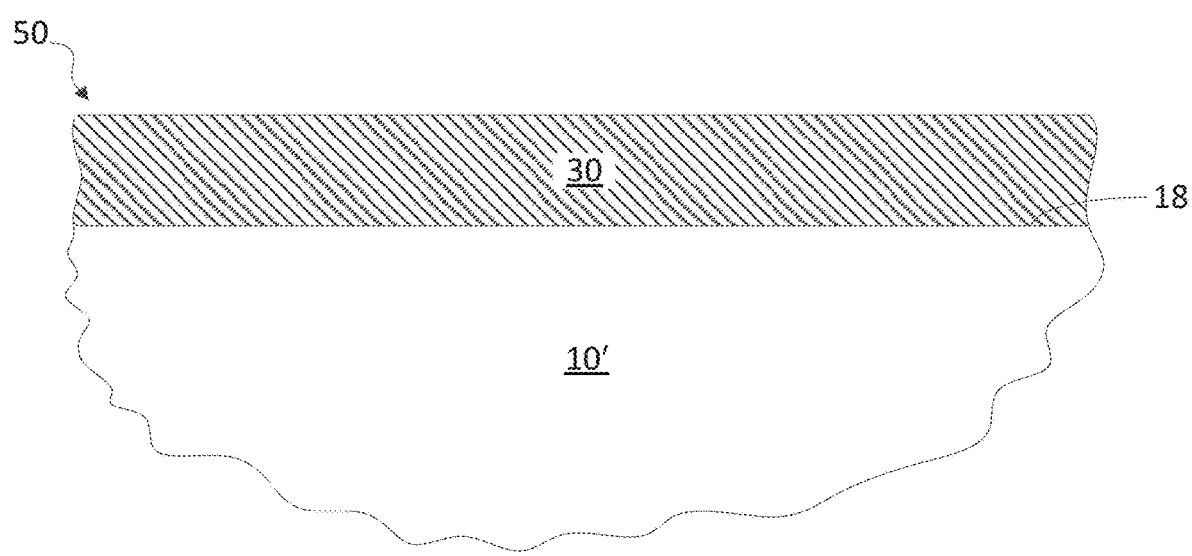
FIG. 1 is a broken-away schematic cross-sectional view of a substrate having a major surface with a static-dissipative coating in accordance with certain embodiments.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The invention provides a coated substrate. A wide variety of substrate types are suitable for use in the invention. In some embodiments, the substrate 10' is a sheet-like substrate having generally opposed first 16 and second 18 major surfaces. For example, the substrate 10' can be a sheet of transparent material (i.e., a transparent sheet). The substrate 10', however, is not required to be a sheet, nor is it required to be transparent.

For many applications, the substrate 10, 10' will comprise a transparent (or at least translucent) material, such as glass or clear plastic. For example, the substrate 10, 10' is a glass sheet (e.g., a window pane) in certain embodiments. A variety of known glass types can be used, and soda-lime glass will commonly be preferred. In certain preferred embodiments, the substrate 10, 10' is part of a window, skylight, door, shower door, or other glazing. In some cases, the substrate 10, 10' is part of an automobile windshield, an automobile side window, an exterior or interior rear-view mirror, or a roof panel. In other embodiments, the substrate 10, 10' is a piece of aquarium glass, a plastic aquarium window, or a piece of greenhouse glass. In a further embodiment, the substrate 10, 10' is a refrigerator panel, such as part of a refrigerator door or window. In still another embodiment, the substrate 10, 10' is part of an oven door or window. In yet another embodiment, the substrate 10, 10' is part of a switchable smart window, such as a switchable privacy window.

Substrates of various sizes can be used in the present invention. Commonly, large-area substrates are used. Certain embodiments involve a substrate 10, 10' having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate 10' is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated.

In some embodiments, the substrate 10, 10' is a generally square or rectangular glass sheet. The substrate in these embodiments can have any of the dimensions described in the preceding paragraph and/or in the following paragraph. In one particular embodiment, the substrate 10, 10' is a generally rectangular glass sheet having a width of between about 3 meters and about 5 meters, such as about 3.5 meters, and a length of between about 6 meters and about 10 meters, such as about 6.5 meters. In another embodiment, the substrate 10, 10' is a generally square glass sheet having a width of between about 4 inches and 8 inches, such as about 6 inches.

Substrates of various thicknesses can be used in the present invention. In some embodiments, the substrate 10, 10' (which can optionally be a glass sheet) has a thickness of about 1-5 mm. Certain embodiments involve a substrate 10, 10' with a thickness of between about 2.3 mm and about 4.8 mm, and perhaps more preferably between about 2.5 mm and about 4.8 mm. In one particular embodiment, a sheet of glass (e.g., soda-lime glass) with a thickness of about 3 mm is used. In one group of embodiments, the thickness of the substrate is between about 4 mm and about 20 mm or perhaps between about 2 mm and about 19 mm. Thicknesses in this range, for example, may be useful for aquarium tanks (in which case, the substrate can optionally be glass or acrylic). When the substrate is float glass, it will commonly have a thickness of between about 4 mm and about 19 mm. In another group of embodiments, the substrate 10, 10' is a thin sheet having a thickness of between about 0.35 mm and about 1.9 mm. Embodiments of this nature can optionally involve the substrate 10, 10' being a sheet of display glass or the like.

Figure 2:
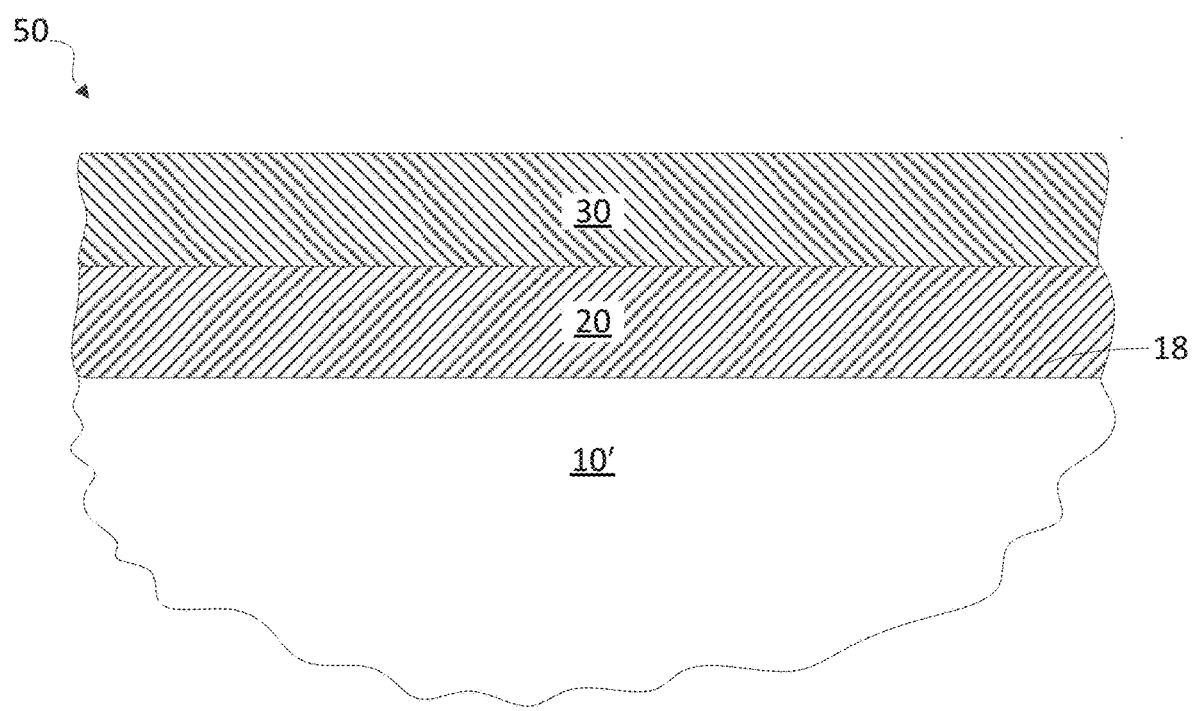
FIG. 2 is a broken-away schematic cross-sectional view of a substrate having a major surface with a static-dissipative coating in accordance with other embodiments.

The invention provides a substrate 10, 10' bearing a static-dissipative coating 50. The static-dissipative coating 50 includes a film 30 comprising titanium oxide (i.e., "titania"). Preferably, the film 30 comprising titania defines an outermost, exposed face of the static-dissipative coating 50. Reference is made to FIGS. 1 and 2.

The static-dissipative coating 50 provides the substrate 10, 10' with a combination of desirable optical properties and surprising low-maintenance properties. For example, it has a small thickness, minimal optical impact, and is static dissipative so as to provide controlled dust collection properties.

The present coating stays cleaner longer than uncoated glass, is easier to clean than uncoated glass, or both. Although the coating 50 may exhibit a level of photoactivity when activated by ultraviolet radiation, it does not rely on ultraviolet activation, or photocatalysis of organics, to provide low-maintenance properties. It is therefore well suited for indoor (e.g., room-side) applications.

The static-dissipative coating 50 preferably provides the substrate 10, 10' with an indoor dust collection factor of less than 0.145. In preferred embodiments, the indoor dust collection factor is less than 0.142 but greater than 0.050, for example less than 0.140 but greater than 0.050. In some embodiments, the indoor dust collection factor is less than 0.128 but greater than 0.050. The indoor dust collection factor reflects the extent to which the coated surface collects dust under defined conditions that have been established to approximate common indoor air movement conditions.

Specifically, the indoor dust collection factor is the dust collected in grams for a given sample as calculated in accordance with the Glass Dust Hazing test method specified in the IBR JN 16775 Protocol, the contents of which are incorporated herein by reference. The purpose of the test is to determine the amount of dust that adheres to a glass surface oriented parallel to air flow. Dust-laden air is swept over the samples. The test is conducted using an air velocity of 1.1 miles/hour (100 feet/minute); a calibrated air flow meter is used. The duct size is 24 inches by 24 inches (stainless steel ducting), and the glass sample size is four inches by four inches. Each glass sample is tested with its coated side facing up. A dust aerosol generator capable of 10 to 50 mg dust per $m^3$ of air is used. The challenge aerosol is ISO 12103-1 A2 Fine Dust (silica dust); a dust concentration of 50 mg/$m^3$ is used. A suitable photometer for measuring dust concentration is the Thermo Electron Model DR-2000. The dust is neutralized using an ion generator to simulate natural conditions. The test area cleaning and setup involves wiping down the ducting with moistened wipes, and purging with HEPA filtered air. The test protocol is as follows. Turn on air flow, and set to the desired rate. Mount a cleaned glass sample in the duct with its coated major surface parallel to the air flow and two inches above the duct base. Inject ISO silica dust to the desired concentration. Neutralize the dust at the generator exit. Monitor dust concentration during exposure with the photometer. Conduct flow for 30 minutes using a stopwatch. Stop the flow. Wipe the test glass with a pre-weighed tack cloth (e.g., HDX Tack Cloth). Weigh the same tack clock after such wiping. An analytical balance accurate to 0.001 g, with span to 60 g, is used to determine the weight difference for the tack cloth, so as to determine the change in weight due to the dust that had accumulated on the coated glass surface and that was subsequently transferred to the tack cloth. The resulting dust collected by the sample (in grams) is the indoor dust collection factor.

In some embodiments, the static-dissipative coating 50 is on a surface of a substrate 10' mounted such that the coating is exposed to an indoor (e.g., room-side) environment, e.g., so as to be exposed to an ambient environment inside a building. Certain embodiments provide an IG unit having the static-dissipative coating 50 on an exterior surface (e.g., a #4 or #6 surface) that is destined to be exposed to an indoor environment.

While the present coating is particularly advantageous for indoor applications, it also offers advantages for use as a #1 surface coating (i.e., a coating on a surface destined to be exposed to an outdoor environment). For example, the static-dissipative coating 50 preferably provides the substrate 10, 10' with an outdoor dust collection factor of less than 0.036, for example less than 0.035. In preferred embodiments, the outdoor dust collection factor is less than 0.032 but greater than 0.010, for example less than 0.030 but greater than 0.010. In some embodiments, the outdoor dust collection factor is less than 0.028 but greater than 0.010. The outdoor dust collection factor reflects the extent to which the coated substrate collects dust under defined conditions that have been established to approximate common outdoor air movement conditions.

As with the indoor dust collection factor, the outdoor dust collection factor is the dust collected in grams for a given sample as calculated in accordance with the Glass Dust Hazing test method specified in the above-noted IBR JN 16775 Protocol. Here again, the purpose of the test is to determine the amount of dust that adheres to a glass surface oriented parallel to air flow when dust-laden air is swept over the samples. Measurement of the outdoor dust collection factor is conducted using an air velocity of 10.0 miles/hour (880 feet/minute) and a duct size of 12 inches by 12 inches (stainless steel ducting). The glass sample size is four inches by four inches, each glass sample is tested with its coated side facing up, a calibrated air flow meter is used, a dust aerosol generator capable of 10 to 50 mg dust per $m^3$ of air is used, the challenge aerosol is ISO 12103-1 A2 Fine Dust, a dust concentration of 50 mg/$m^3$ is used, and a suitable photometer for measuring dust concentration is the Thermo Electron Model DR-2000. The dust is neutralized using an ion generator to simulate natural conditions. The test area cleaning and setup involves wiping down the ducting with moistened wipes, and purging with HEPA filtered air. As with the indoor dust collection factor, the test protocol for the outdoor dust collection factor is as follows. Turn on air flow, and set to the desired rate. Mount a cleaned glass sample in the duct with its coated major surface parallel to the air flow and two inches above the duct base.

Inject ISO silica dust to the desired concentration. Neutralize the dust at the generator exit. Monitor dust concentration during exposure with the photometer. Conduct flow for 30 minutes using a stopwatch. Stop the flow. Wipe the test glass with a pre-weighed tack cloth. Weigh the same tack clock after such wiping. An analytical balance accurate to 0.001 g, with span to 60 g, is used to determine the weight difference for the tack cloth, so as to determine the change in weight due to the dust that had accumulated on the coated glass surface and that was subsequently transferred to the tack cloth. The resulting dust collected by the sample (in grams) is the outdoor dust collection factor.

Figure 5:
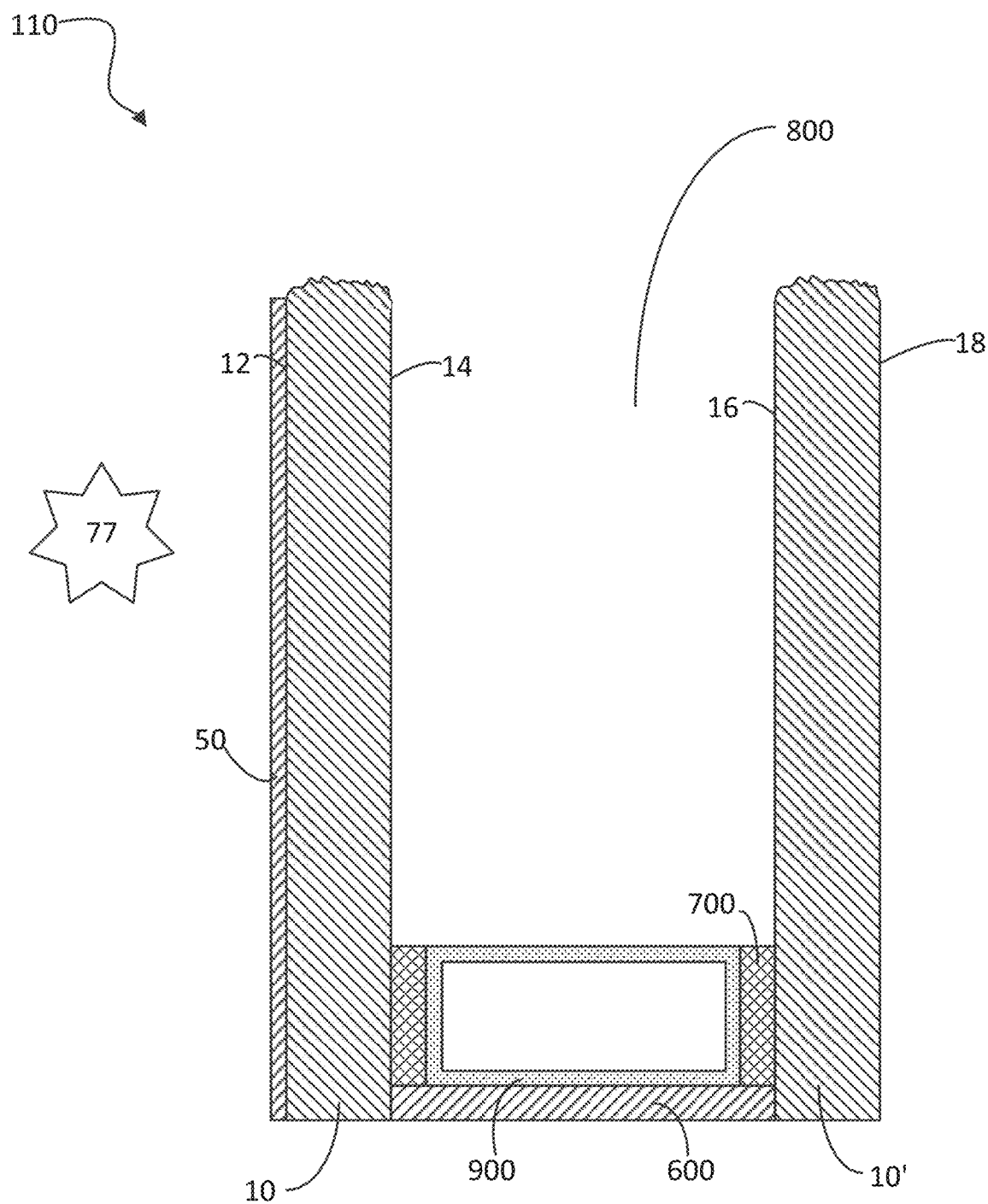
FIG. 5 is a partially broken-away schematic cross-sectional side view of a multiple-pane insulating glazing unit that includes an interior pane having a room-side surface with a static-dissipative coating in accordance with other embodiments.

Thus, in some embodiments, the static-dissipative coating is on a #1 surface of a substrate 10 mounted such that the coating is exposed to an outdoor environment, e.g., so as to be exposed to periodic contact with rain. Certain embodiments provide an IG unit having the static-dissipative coating 50 on an exterior surface (i.e., a #1 surface) that is destined to be exposed to an outdoor environment. Such an embodiment is shown in FIG. 5.

The static-dissipative coating 50 of any embodiment of the present disclosure can optionally provide the substrate with a surface roughness $R_a$ in the range of between about 0.05 nm and about 5 nm, such as between 0.2 nm and 4 nm. Surface roughness is defined in terms of deviations from the mean surface level. In certain embodiments, the surface roughness is less than 0.25, or even less than 0.22, such as from 0.05 to 0.20. The surface roughness $R_a$ is the arithmetical mean surface roughness. This is the arithmetic average of the absolute deviations from the mean surface level. The arithmetical mean surface roughness of a coating is commonly represented by the equation: $R_a = 1/L \int_0^L |f(x)| dx$. The surface roughness $R_a$ can be measured in conventional fashion, e.g., using an Atomic Force Microscope (AFM) equipped with conventional software that gives $R_a$.

In addition to having a surface roughness in one or more of the ranges noted in the preceding paragraph, the static-dissipative coating 50 preferably provides the substrate 10, 10' with a wet dynamic coefficient of friction of less than 0.1, less than 0.075, or even less than 0.07. In some embodiments, the wet dynamic coefficient of friction of the coated surface is in the range of from about 0.01 to about 0.065, such as about 0.05. The wet dynamic coefficient of friction is measured as follows. The coated glass sample is placed horizontally in a test instrument (Mecmesin Multitest 2.5-i), covered with Windex, and a 2.5 ounce test puck is placed on top of the sample. The bottom of the puck has a piece of crock cloth on it in contact with the coated sample surface (the crock cloth is an ISO standard material commercially available from Testfabrics, Inc., of West Pittston, Pa. USA). The puck is drawn across the coated surface, and the force required to do so is measured. As the puck is moving, the force is constant. This friction force is compared to the downward (gravitational) force of the puck to determine a coefficient of (wet) dynamic friction. The numbers reported herein are for fresh glass with the film 30 comprising titania in an un-activated-by-UV state.

The static-dissipative coating 50 preferably has a total thickness of less than 500 angstroms, or less than 350 angstroms, such as greater than 30 angstroms and less than 300 angstroms. In some cases, the thickness of the static-dissipative coating 50 is less than 250 angstroms, or even less than 200 angstroms, such as greater than 25 angstroms and less than 200 angstroms. In one embodiment, the thickness of the static-dissipative coating 50 is about 60 angstroms. In another embodiment, the thickness of the static-dissipative coating 50 is about 160 angstroms.

FIG. 1 shows a substrate 10' with a major surface 18 bearing a static-dissipative coating 50 according to one embodiment. In some cases, the static-dissipative coating 50 includes one or more other films beneath the film 30 comprising titania. In other cases, the static-dissipative coating 50 has only a single film 30, which is directly on (i.e., in contact with) the substrate 10'. In such cases, the static-dissipative coating 50 consists of the film 30 comprising titania.

FIG. 2 shows a substrate 10' with a major surface 18 bearing a static-dissipative coating 50 according to another embodiment. In FIG. 2, the static-dissipative coating 50 includes both the film 30 comprising titania and a base film 20. In some cases, the static-dissipative coating 50 further includes one or more other films beneath the film 30 comprising titania. For example, one or more other films can be provided beneath the base film 20, between the base film 20 and the film 30 comprising titania, or both. In other cases, the static-dissipative coating 50 consists essentially of, or consists of, the base film 20 and the film 30 comprising titania.

The present coating 50 preferably has a level of electrical conductivity. However, even for embodiments where this is the case, the surface resistance of the coating 50 is relatively large. For example, the surface resistance preferred for the static-dissipative coating 50 is well above the typical range reported for anti-static coatings, which is $10^0$-$10^3$ ohms/square. By comparison, the present static-dissipative coating 50 preferably has a surface resistance of greater than $10^6$ ohms per square. In some cases, the surface resistance is greater than $10^6$ ohms per square but less than $10^{11}$ ohms per square. In certain preferred embodiments, the surface resistance is greater than $10^8$ ohms per square but less than $10^{11}$ ohms per square, such as greater than $3.0 \times 10^9$ ohms per square but less than $7.0 \times 10^9$ ohms per square. Surface resistance can be measured in standard fashion using a surface resistivity meter. The noted surface resistance numbers reflect measurements taken at room temperature and 30% relative humidity.

The static-dissipative coating 50 preferably is devoid of a transparent conductive oxide layer (e.g., a layer formed of ITO, FTO, AZO, or any other electrically conductive oxide material) beneath the film 30 comprising titania. In any embodiment of the present disclosure, the static-dissipative coating 50 can optionally be devoid of any electrically conductive film (e.g., a layer formed of metal or TCO) beneath the film 30 comprising titania. In such cases, if desired a transparent conductive oxide layer or another electrically conductive film can still be provided on an opposite side of the substrate.

In some embodiments, the film 30 comprising titania includes $TiO_2$, TiO, or both. In some cases, the film 30 comprising titania consists essentially of (or consists of) titanium oxide. In such cases, the film comprising titania is devoid of any additional material, such as a dopant. In other cases, the film 30 comprising titania further includes a dopant. The optional dopant material can generally be present in an amount of up to ten atomic percent, e.g., about five atomic percent or less. As one example, the film 30 comprising titania can also include tungsten.

The film 30 comprising titania can be doped with a material, and to a level, that provide an electrical conductivity within one or more of the ranges noted above. In embodiments of this nature, the film 30 comprising titania preferably is doped with a material, and to a level, that provide the particular indoor and/or outdoor dust collection factors noted above. The dopant can be tungsten, niobium, silver, zirconium, tantalum, sodium, aluminum, zinc, chromium, vanadium, nitrogen, manganese, molybdenum, iron, nickel, calcium carbon, sulfur, boron, phosphorous, fluorine, or iodine, or mixtures or compound of these elements.

Additionally or alternatively, to provide a level of electrical conductivity, the film 30 comprising titania can include substoichiometric titanium oxide, i.e., $TiO_x$, where x is less than 2. The suboxide composition can be chosen to help provide an electrical conductivity within one or more of the ranges noted above. In embodiments of this nature, the suboxide composition preferably is chosen to help provide the particular indoor and/or outdoor dust collection factors noted above. In some cases, the film 30 comprises or consists essentially of (or consists of) $TiO_x$, where x is less than 2. For example, the film 30 can optionally comprise or consist essentially of (or consist of) $TiO_x$, where x is less than 2 but greater than 1.8. In these cases, the $TiO_x$ is devoid of an additional material such as a dopant.

In other cases, the film 30 comprising titania includes both tungsten (or another dopant selected from the list above) and $TiO_x$, where x is less than 2. For example, the film 30 comprising titania can optionally include both tungsten (or another dopant selected from the list above) and $TiO_x$, where x is less than 2 but greater than 1.8.

The film 30 comprising titania can be a homogenous film, a graded film, or another type of non-homogenous film. The thickness of the film 30 comprising titania preferably is less than 500 Å, such as greater than 30 angstroms and less than 300 angstroms. In some embodiments, the thickness of the film 30 comprising titania is less than 250 Å, such as less than 200 Å, less than 150 Å, or even less than 100 Å. The thickness of the film 30 comprising titania is greater than 25 Å, and preferably 30 Å or greater, such as in the range of 30-95 Å. In certain embodiments, the film 30 consists of titania (or titania doped with one or more of the materials noted above) at a thickness of 30-75 Å, such as about 60 Å. In some of these embodiments, the titania is substoichiometric titanium oxide.

When provided, the base film 20 can be any suitable thin film material that adheres well to both the substrate 10, 10' and the immediately overlying film (which may be the film 30 comprising titania). In cases where the substrate 10, 10' is soda-lime glass, the base film 20 preferably also protects the film 30 comprising titania from sodium ion diffusion. In cases where the base film 20 is omitted and the substrate 10, 10' is soda-lime glass, the surface of the substrate itself can optionally be treated to reduce, or perhaps deplete, the sodium ions in the surface area of the glass.

The base film 20 can be a transparent dielectric film. In certain embodiments, the base film comprises silica, alumina, or both. The base film 20 can optionally be a mixed film including two or more metals or semi-metals. In some cases, it is a mixed film comprising silica and alumina, or silica and titania, or silica, alumina and titania. Other materials can be used instead. In some embodiments, the base film consists essentially of (or consists of) silica, or consists essentially of (or consists of) alumina. In other embodiments, the base film consists essentially of (or consists of) silicon nitride, or consists essentially of (or consists of) silicon oxynitride. The base film 20 can be a substantially homogenous film or a graded film. When provided, the base film 20 can be deposited directly onto the substrate, with the film 30 comprising titania deposited directly onto the base film 20. This, however, is by no means required.

When provided, the base film 20 can optionally have a thickness of less than about 300 Å. In certain embodiments, the base film 20 has a thickness of less than 150 Å. As one example, the base film 20 can comprise silica at a thickness of about 100 Å.

Figure 3:
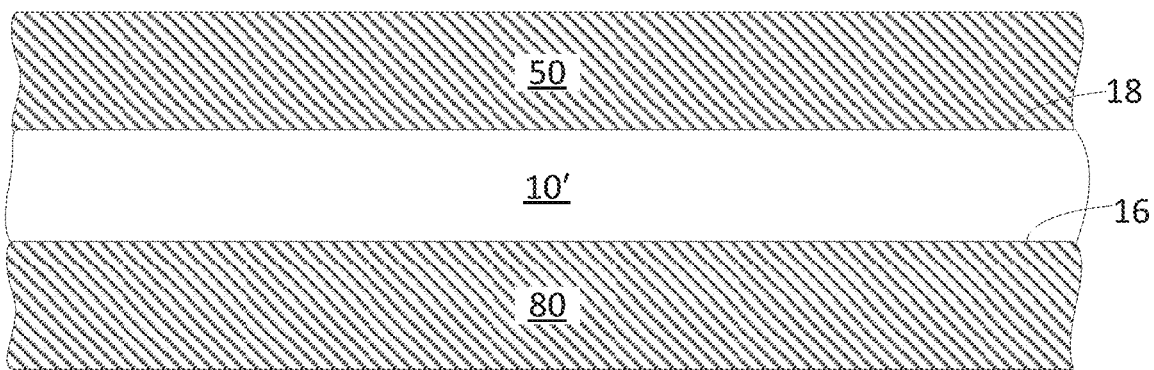
FIG. 3 is a broken-away schematic cross-sectional view of a substrate having a first major surface with a static-dissipative coating and a second major surface with a functional coating in accordance with certain embodiments.

In certain embodiments, the static-dissipative coating 50 is provided on one major surface of a substrate 10, 10' and another functional coating 80 is provided on an opposite major surface of the same substrate. FIG. 3 shows one such embodiment. Here, the illustrated substrate 10' has one surface 18 bearing the static-dissipative coating 50 and another surface 16 bearing another functional coating 80. Functional coating 80 can be a single layer or a stack of layers. Various functional coatings can be used. For example, functional coating 80 can optionally be a low-emissivity coating comprising one or more infrared-reflective metallic films. Such metallic film(s) commonly comprise (e.g., are formed of) silver. Suitable low-emissivity coatings are described in U.S. Pat. Nos. 9,376,853 7,192,648 7,060,359 and 7,101,810, the contents of which are incorporated herein by reference. When provided, functional coating 80 can alternatively be a transparent conductive oxide coating, i.e., a coating comprising at least one transparent conductive oxide layer, such as ITO, FTO, AZO, or the like. Suitable transparent conductive oxide coatings are described in U.S. Pat. No. 9,453,365, the contents of which are incorporated herein by reference.

Figure 4:
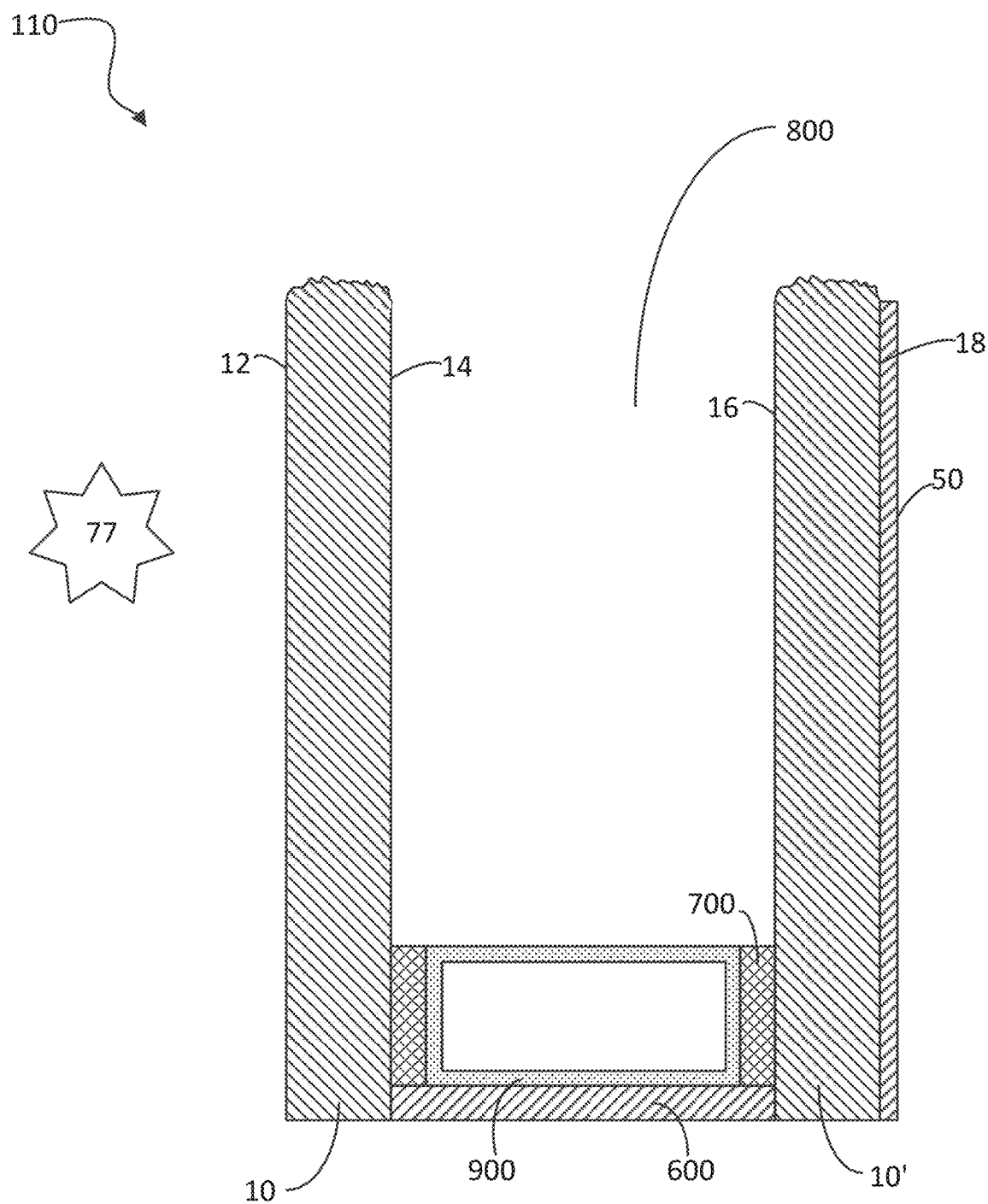
FIG. 4 is a partially broken-away schematic cross-sectional side view of a multiple-pane insulating glazing unit that includes an interior pane having a room-side surface with a static-dissipative coating in accordance with certain embodiments.

In the embodiment of FIG. 4, substrate 10' is a transparent pane (e.g., a glass sheet) that is part of a multiple-pane insulating glazing unit 110. Typically, the insulating glazing unit 110 has an exterior pane 10 and an interior pane 10' separated by at least one between-pane space 800. At least one spacer 900 (which can optionally be part of a sash) is commonly provided to separate the panes 10 and 10'. The spacer 900 can be secured to the interior surfaces of each pane using an adhesive or seal 700. In some cases, an end sealant 600 is also provided. In the illustrated embodiment, the exterior pane 10 has an exterior surface 12 (the #1 surface) and an interior surface 14 (the #2 surface). The interior pane 10' has an interior surface 16 (shown as a #3 surface) and an exterior surface 18 (shown as a #4 surface), which is the room-side surface. The IG unit can optionally be mounted in a frame (e.g., a window frame) such that the exterior surface 12 of the exterior pane 10 is exposed to an outdoor environment 77 while the exterior surface 18 of the interior pane 10' is exposed to a room-side interior environment. Interior surfaces 14 and 16 are both exposed to the atmosphere in the between-pane space 800 of the insulating glazing unit. While FIG. 4 shows a double-pane IG unit, other embodiments provide a triple-pane IG unit having the static-dissipative coating 50 on the #6 surface, the #1 surface, or both.

The IG unit 110 can be filled with a conventional insulative gas mix (e.g., argon and air), or it can be a vacuum IG unit. In other embodiments, it is a switchable smart glazing, such as a privacy glazing switchable between transparent and opaque states.

When it is desired to provide a room-side surface of a window or other glazing with low-maintenance properties, the static-dissipative coating 50 can be provided quite advantageously. Thus, in the embodiment of FIG. 4, the exterior surface 18 of pane 10' has the static-dissipative coating 50. The static-dissipative coating 50 shown in FIG. 4 can be in accordance with any embodiment of the present disclosure. Of course, skilled artisans would understand that the static-dissipative coating 50 can be provided on the exterior surface 12 of pane 10 in other embodiments, as illustrated in FIG. 5.

With continued reference to FIG. 4, it is to be appreciated that the interior surface 14 of pane 10 can optionally have a functional coating, such as a low-emissivity coating. Additionally or alternatively, the interior surface 16 of pane 10' can optionally have a functional coating, such as a low-emissivity coating or a transparent conductive coating. Moreover, while FIG. 4 shows a double-pane IG unit, it can alternatively have three or more panes. Further, the static-dissipative coating 50 can additionally or alternatively be provided on the #1 surface of the IG unit 110.

Methods for producing a substrate 10, 10' bearing a static-dissipative coating 50 are also provided. In such methods, each film of the coating 50 can be deposited using any of a variety of well-known coating techniques. Suitable coating techniques include, but are not limited to, sputter deposition, chemical vapor deposition (CVD), plasma enhanced chemical vapor deposition, pyrolytic deposition, sol-gel deposition, and wet chemical deposition. In preferred embodiments, the coating 50 is deposited by sputtering. Sputtering is well known in the present art.

Figure 6:
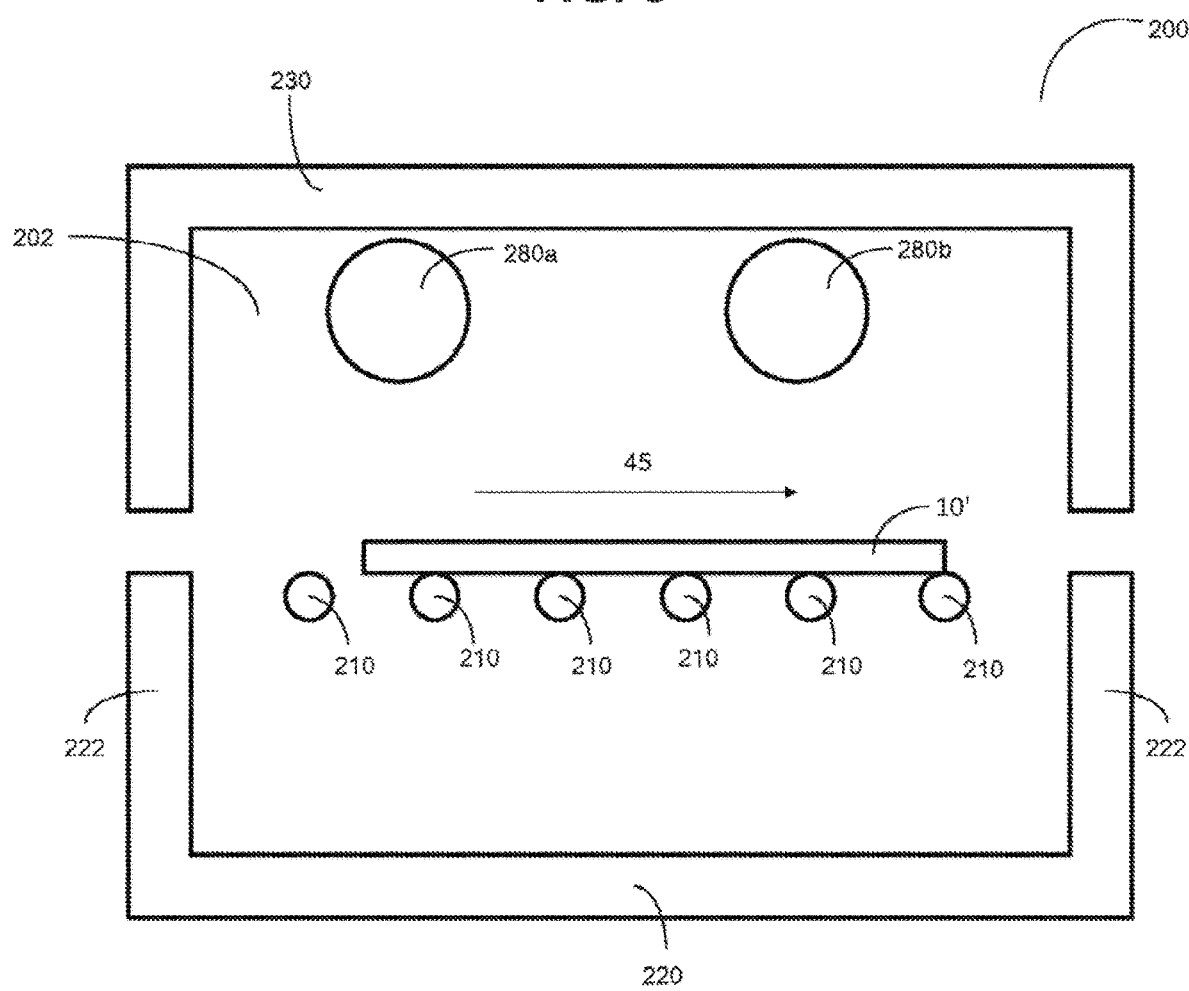
FIG. 6 is a schematic cross-sectional side view of a sputtering chamber used to deposit a static-dissipative coating in accordance with certain embodiments.

FIG. 6 schematically depicts an exemplary magnetron sputtering chamber 200 that can be used to deposit a static-dissipative coating 50. Magnetron sputtering chambers and related equipment are commercially available from a variety of sources (e.g., Leybold). Useful magnetron sputtering techniques and equipment are described in U.S. Pat. No. 4,166,018, issued to Chapin, the teachings of which are incorporated herein by reference. The sputtering chamber 200 shown in FIG. 6 includes a base (or "floor") 220, a plurality of side walls 222, and a ceiling (or "top lid" or "cover") 230, together bounding a sputtering cavity 202. In FIG. 6, two upper targets 280a, 280b are shown mounted above the path of substrate travel 45. The substrate 10' is conveyed along the path of substrate travel 45 during film deposition, optionally over a plurality of spaced-apart transport rollers 210. In FIG. 6, two upper targets are provided in the illustrated sputtering chamber, although this is by no means required. For example, a single sputtering target (cylindrical or planar) can alternatively be provided in the sputtering chamber. As another possibility, the target(s) could be lower targets positioned below the path of substrate travel and adapted for upwardly sputter depositing the static-dissipative coating 50 onto a bottom surface of the substrate.

In certain embodiments, a method of depositing a static-dissipative coating 50 is provided. The method includes depositing the film 30 comprising titania onto a major surface of a substrate. The sputtering chamber of FIG. 6 can be used to deposit the film 30. Thus, targets 280a, 280b can be titanium-containing targets. In some cases, the titanium-containing targets 280a, 280b have a sputterable material that consists of metallic titanium. In other cases, the titanium-containing targets 280a, 280b have a sputterable material that includes both metallic titianium and a metallic dopant, such as tungsten. In still other cases, the targets have a sputterable material comprising substoichiometric titanium oxide, and the sputtering is carried out in an inert gas atmosphere or a gas atmosphere with little or no oxygen.

As noted above, the film 30 can in some cases comprise substoichiometric $TiO_x$, where x is less than 2. In such cases, a sputtering chamber as shown in FIG. 6 can be used, and the targets 280a, 280b can each have a sputterable material comprising titanium. For example, the targets each have a sputterable material comprising substoichiometric titanium oxide, and an inert (or weakly oxygen) atmosphere can be used in the chamber. In such cases, different levels of oxygen can be used in the sputtering chamber. More will be said of this later. In other cases, the targets 280a, 280b each have a sputterable material consisting of metal titanium, and an oxygen-containing atmosphere is used for sputter-depositing the film 30.

In some embodiments, the targets 280a and 280b each have a titanium-containing sputterable material, and they are sputtered under conditions selected to deposit a film 30 comprising substoichiometric $TiO_x$, where x is less than 2. This may involve sputtering in an inert gas atmosphere or a gas atmosphere with little or no oxygen. Metallic titanium targets, for example, can be sputtered in an atmosphere comprising between 10% to 35% argon with the remainder being oxygen (e.g., in an atmosphere comprising between 15% to 25% argon with the remainder being oxygen, or perhaps in an atmosphere comprising between 17% to 23% argon with the remainder being oxygen, such as about 20% argon with the remainder being oxygen).

In certain embodiments, the sputterable material consists essentially of titanium metal and tungsten metal. For example, an alloy target comprising both titanium and tungsten can be used. Alternatively, one could use a metal titanium target provided with strips (or the like) of metal tungsten. Another possibility is a metal alloy target with tungsten metal strips attached. When metal targets are sputtered, an oxygen atmosphere (optionally with a small amount of nitrogen) can be used. In other cases, the sputterable material comprises both titanium oxide and tungsten oxide. In these cases, an inert atmosphere or slight oxygen atmosphere (optionally with a small amount of nitrogen) can be used. In certain embodiments, the sputterable material comprises titanium monoxide, titanium dioxide, and tungsten oxide. In these embodiments, a weakly oxygen atmosphere (optionally containing a small amount of nitrogen) can be used. Or, the targets could be sputtered in an inert atmosphere, e.g., if the resulting film is not required to be deposited in fully oxidized form. In certain cases, the sputterable material is characterized by a metal-only atomic ratio of between about 0.01 and 0.34, this ratio being the number of tungsten atoms in the sputterable material divided by the number of titanium atoms in the sputterable material.

A target with sputterable material comprising both titanium and tungsten can be prepared using a number of different methods. In some embodiments, a target is prepared by plasma spraying titanium oxide together with tungsten metal onto a target base in an atmosphere that is oxygen deficient and does not contain oxygen-containing compounds. During the plasma spraying process, the action of the plasma on the titanium oxide causes the titanium oxide to lose some oxygen atoms from their lattices. These oxygen atoms are believed to combine with the metal tungsten to form tungsten oxide, as tungsten has a high electrochemical potential. The titanium oxide sprayed onto the backing tube may thus comprise titanium monoxide, titanium dioxide, and tungsten oxide. The sputterable target may, as just one example, be a cylindrical rotary target having a backing tube with a length of at least 24 inches. In such cases, the sputterable material is carried on an exterior wall of the backing tube. Such a cylindrical target is adapted to rotate about a central axis to which the exterior wall of the backing tube is substantially parallel. Alternatively, hot isostatic pressing may be used to form a target. Other target forming methods can also be used. Suitable targets are also commercially available, from a number of well-known suppliers, such as Soleras Advanced Coatings BVBA, of Deinze, Belgium.

When the film 30 comprising titania is deposited by sputtering one or more targets comprising substoichiometric TiO$_x$, the sputtering is preferably carried out using argon, a mixture of argon and oxygen, a mixture of nitrogen and argon, a mixture of nitrogen and oxygen, or a mixture of oxygen, nitrogen, and argon. If the plasma gas does not contain oxygen, e.g., if pure argon is used, then the coating will not be fully oxidized when deposited. In contrast, if the plasma gas contains oxygen, then the reduced form(s) of titanium oxide may be converted during the sputtering process into the transparent form, which is stoichiometric or at least substantially stoichiometric. A film comprising titania and tungsten oxide can be produced in this way. The degree of transparency of the film will depend upon the amount of oxygen in the plasma gas. An exemplary gas mixture to form transparent film is about 20% by volume argon and about 80% by volume of oxygen.

Example 1 (Control)

A coating consisting of 60 angstroms of TiO$_2$ was deposited onto a major surface of a soda-lime glass sheet. The coating was deposited by pulsed DC sputtering, at a power of 5 kW, a frequency of 50 kHz, a voltage of 379, and an amperage of 13.19. Two passes of the substrate were made under a metallic titanium target. The conveyance speed was 29.43 inches per minute. The following process parameters were used: 100% O$_2$ gas, flow rate of 610 sccm, and pressure of 4.5 mtorr. The surface resistance of the resulting coating was about $3.5 \times 10^{11}$ ohms/square. The resulting film was deposited as fully stoichiometric TiO$_2$.

Example 2

A static-dissipative coating consisting of 62 angstroms of substoichiometric titanium oxide (TiO$_x$, where x is 1.8 or higher and less than 2) was deposited onto a major surface of a soda-lime glass sheet. The coating was deposited by pulsed DC sputtering, at a power of 5 kW, a frequency of 50 kHz, a voltage of 371, and an amperage of 13.49. Two passes of the substrate were made under a metallic titanium target. The conveyance speed was 25.89 inches per minute. The following process parameters were used: 20% argon/80% O$_2$ gas mix, argon flow rate of 153 sccm, oxygen flow rate of 438 sccm, and pressure of 4.5 mtorr. The surface resistance of the resulting coating was about $1.8 \times 10^{10}$ ohms/square.

Example 3

A static-dissipative coating consisting of 60 angstroms of substoichiometric titanium oxide (TiO$_x$ where x=1.8 or higher) was deposited onto a major surface of a soda-lime glass sheet. The coating was deposited by pulsed DC sputtering, at a power of 5 kW, a frequency of 50 kHz, a voltage of 363, and an amperage of 13.79. Two passes of the substrate were made under a metallic titanium target. The conveyance speed was 24.87 inches per minute. The following process parameters were used: 50% argon/50% O$_2$ gas mix, argon flow rate of 305 sccm, oxygen flow rate of 305 sccm, and pressure of 4.5 mtorr. The surface resistance of the resulting coating was about $5.8 \times 10^9$ ohms/square. The value x in Example 3 is lower than the value x in Example 2.

Results

In dust collection testing, Example 2 performed about 12% better than Example 1, while Example 3 performed about 7% better than Example 1. Thus, both Example 2 and Example 3 exhibited better dust collection properties than Example 1 (Control). The surface resistance of Example 3 was smaller than that of Example 2. Surprisingly, even though Example 3 was more electrically conductive (and had a lower x value for the TiO$_x$) than in than Example 2, Example 2 exhibited better dust collection properties than Example 3.

Thus, certain embodiments of the invention provide a static-dissipative coating 50 that includes a film 30 comprising substoichiometric titanium oxide film produced by sputtering in an atmosphere comprising a mix of oxygen gas and inert gas (such as argon), where the sputtering gas mix comprises about 10-35% inert gas (e.g., argon) and about 65-90% oxygen gas, such as 15-25% inert gas (e.g., argon) and 75-85% oxygen gas. This particular type of substoichiometric titanium oxide can be used as the film 30 comprising titania in any embodiment of the present disclosure.

While certain preferred embodiments of the invention have been described, it should be understood that various changes, adaptations and modifications can be made without departing from the spirit of the invention and the scope of the appended claims.

What is claimed is:

1. An insulating glass unit including an exterior pane and an interior pane, the interior pane being a transparent substrate having an exterior surface on which there is provided a static-dissipative coating, the exterior pane having an interior surface that bears a low-emissivity coating, the low-emissivity coating comprising one or more infrared-reflective metallic films comprising silver, the exterior pane having an exterior surface that is a #1 surface, the interior surface of the exterior pane being a #2 surface, and the exterior surface of the interior pane being a #4 or #6 surface, the static-dissipative coating including a film comprising titania over a base film, the film comprising titania having a thickness of less than 300 angstroms but greater than 30 angstroms, and the static-dissipative coating has a surface resistance of greater than $10^8$ ohms per square but less than $10^{11}$ ohms per square, wherein the film comprising titania is exposed so as to define an outermost face of the static-dissipative coating, and the static-dissipative coating has a surface roughness R$_a$ in a range of between about 0.05 nm and about 5.0 nm, the static-dissipative coating characterized by an indoor dust collection factor of less than 0.142 but greater than 0.050.

2. The insulating glass unit of claim 1 wherein the indoor dust collection factor is less than 0.128 but greater than 0.050.

3. The insulating glass unit of claim 1 wherein the static-dissipative coating is characterized by an outdoor dust collection factor of less than 0.036.

4. The insulating glass unit claim 3 wherein the outdoor dust collection factor is less than 0.032 but greater than 0.010.

5. The insulating glass unit claim 4 wherein the outdoor dust collection factor is less than 0.030 but greater than 0.010.

6. The insulating glass unit of claim 1 wherein the surface resistance of the static-dissipative coating is greater than $3.0 \times 10^9$ ohms per square but less than $7.0 \times 10^9$ ohms per square.

7. The insulating glass unit of claim 1 wherein the static-dissipative coating is devoid of an electrically conductive film beneath the film comprising titania.

8. The insulating glass unit of claim 1 wherein the static-dissipative coating has a wet dynamic coefficient of friction of less than 0.07.

9. An insulating glass unit comprising two spaced-apart panes bounding a between-pane space, wherein one of the panes has an exterior surface that is exposed to an interior of a building and that bears a static-dissipative coating, the static-dissipative coating including a film comprising titania over a base film, the film comprising titania having a thickness of less than 300 angstroms but greater than 30 angstroms, and the static-dissipative coating has a surface resistance of greater than $3.0 \times 10^9$ ohms per square but less than $7.0 \times 10^9$ ohms per square, wherein the film comprising titania is exposed so as to define an outermost face of the static-dissipative coating, the static-dissipative coating characterized by an indoor dust collection factor of less than 0.142 but greater than 0.050.

10. The insulating glass unit of claim 9 wherein the indoor dust collection factor is less than 0.128 but greater than 0.050.

11. The insulating glass unit of claim 9 wherein the static-dissipative coating is characterized by an outdoor dust collection factor of less than 0.036.

12. The insulating glass unit of claim 11 wherein the outdoor dust collection factor is less than 0.032 but greater than 0.010.

13. The insulating glass unit of claim 12 wherein the outdoor dust collection factor is less than 0.030 but greater than 0.010.

14. The insulating glass unit of claim 9 wherein the film comprising titania consists of titanium oxide, and the static-dissipative coating is devoid of an electrically conductive film beneath the film comprising titania.

15. The insulating glass unit of claim 9 wherein the static-dissipative coating has a surface roughness $R_a$ in a range of between 0.2 nm and 4 nm in combination with having a wet dynamic coefficient of friction of less than 0.07.

16. The insulating glass unit of claim 1 wherein the base film has a thickness of less than about 300 angstroms.

17. The insulating glass unit of claim 1 wherein the film comprising titania includes nitrogen as a dopant.

18. The insulating glass unit of claim 1 wherein the base film consists of silica, the base film is deposited directly onto the exterior surface of the interior pane, and the film comprising titania is deposited directly onto the base film.

19. The insulating glass unit of claim 9 wherein the base film has a thickness of less than about 300 angstroms.

20. The insulating glass unit of claim 9 wherein the film comprising titania includes nitrogen as a dopant.

21. The insulating glass unit of claim 9 wherein the base film consists of silica, the base film is deposited directly onto said exterior surface, and the film comprising titania is deposited directly onto the base film.

22. An insulating glass unit including an exterior pane and an interior pane, the interior pane being a transparent substrate having an exterior surface on which there is provided a static-dissipative coating, the exterior pane having an interior surface that bears a low-emissivity coating, the low-emissivity coating comprising one or more infrared-reflective metallic films comprising silver, the exterior pane having an exterior surface that is a #1 surface, the interior surface of the exterior pane being a #2 surface, and the exterior surface of the interior pane being a #4 or #6 surface, the static-dissipative coating including a film comprising titania over a base film, the film comprising titania having a thickness of less than 300 angstroms but greater than 30 angstroms, and the static-dissipative coating has a surface resistance of greater than $10^8$ ohms per square but less than $10^{11}$ ohms per square, wherein the film comprising titania is exposed so as to define an outermost face of the static-dissipative coating, the static-dissipative coating having a surface roughness $R_a$ in a range of between 0.2 nm and 4 nm in combination with having a wet dynamic coefficient of friction of less than 0.07, the static-dissipative coating characterized by an indoor dust collection factor of less than 0.140 but greater than 0.050.

* * * * *